(12) United States Patent
Almalkawi

(10) Patent No.: US 12,323,168 B2
(45) Date of Patent: Jun. 3, 2025

(54) ACOUSTIC-WAVE LADDER FILTERS

(71) Applicant: Skyworks Solutions, Inc., Irvine, CA (US)

(72) Inventor: Mohammad Jehad Almalkawi, Stokesdale, NC (US)

(73) Assignee: Skyworks Solutions, Inc., Irvine, CA (US)

( * ) Notice: Subject to any disclaimer, the term of this patent is extended or adjusted under 35 U.S.C. 154(b) by 279 days.

(21) Appl. No.: 17/894,891

(22) Filed: Aug. 24, 2022

(65) Prior Publication Data

US 2023/0071426 A1    Mar. 9, 2023

Related U.S. Application Data

(60) Provisional application No. 63/237,081, filed on Aug. 25, 2021, provisional application No. 63/237,083, filed on Aug. 25, 2021.

(51) Int. Cl.
*H04B 1/00* (2006.01)
*H03H 7/01* (2006.01)
(Continued)

(52) U.S. Cl.
CPC .......... *H04B 1/0057* (2013.01); *H03H 7/075* (2013.01); *H03H 7/09* (2013.01); *H03H 9/25* (2013.01);
(Continued)

(58) Field of Classification Search
CPC ........ H03H 9/706; H03H 9/605; H03H 9/542; H03H 9/6483; H03H 9/725; H03H 9/205;
(Continued)

(56) References Cited

U.S. PATENT DOCUMENTS 5,694,095 A    12/1997    Mineyoshi
6,606,016 B2    8/2003    Takamine
(Continued)

FOREIGN PATENT DOCUMENTS

EP          1727281       11/2006
JP        2008-005277      1/2008
(Continued)

OTHER PUBLICATIONS

Yen, Sean, "Lithium Niobate Resonators and Filters Toward Reconfigurable Filter Banks," Submitted in partial fulfillment of the requirements for the degree of Doctor of Philosophy in Electrical and Computer Engineering, Carnegie Mellon University, Jun. 20, 2016, pp. 1-190.
(Continued)

*Primary Examiner* — Lincoln D Donovan
*Assistant Examiner* — Tyler J Pereny
(74) *Attorney, Agent, or Firm* — Knobbe, Martens, Olson & Bear, LLP

(57) ABSTRACT

Aspects of this disclosure relate to bandpass filters with enhanced out of band rejection. The bandpass filters include a stage that is modified using a network of three inductors two of which are mutually coupled inductors. Related methods, radio frequency systems, radio frequency modules, and wireless communication devices are also disclosed.

20 Claims, 22 Drawing Sheets

(51) Int. Cl.
  *H03H 7/075* (2006.01)
  *H03H 7/09* (2006.01)
  *H03H 9/25* (2006.01)
  *H03H 9/64* (2006.01)

(52) U.S. Cl.
  CPC ..... *H03H 9/6483* (2013.01); *H03H 2007/013* (2013.01)

(58) Field of Classification Search
  CPC .. H03H 7/1758; H03H 7/0115; H03H 7/1766; H03H 7/463; H03H 2007/013; H03H 7/0138; H03H 9/02007; H03H 9/64; H03H 9/568; H03H 7/09; H03H 9/02118; H03H 9/703; H03H 9/02086; H03H 9/25; H03H 7/075; H03H 9/0504; H04B 1/1036; H04B 1/0057; H04B 1/40; H04B 1/0475; H04B 2001/1063; H04B 2001/1072; H01Q 1/50; H04L 5/1461; H03F 1/565; H03F 2200/111; H03F 2200/171; H03F 2200/451; H03F 3/19; H03F 3/245
  See application file for complete search history.

(56) References Cited

U.S. PATENT DOCUMENTS

| | | |
|---|---|---|
| 6,747,530 B1 | 6/2004 | Selmeier |
| 6,842,086 B1 * | 1/2005 | Zennamo, Jr. ....... H03H 7/0153 333/175 |
| 6,844,795 B2 | 1/2005 | Inose |
| 7,061,345 B2 | 6/2006 | Misu et al. |
| 7,592,883 B2 | 9/2009 | Shafer |
| 7,626,475 B2 | 12/2009 | Taniguchi |
| 7,683,736 B2 | 3/2010 | Inoue et al. |
| 8,923,794 B2 | 12/2014 | Aigner |
| 9,154,114 B2 | 10/2015 | Ikeuchi |
| 9,246,536 B2 | 1/2016 | Caron |
| 9,509,279 B2 | 11/2016 | Nosaka |
| 9,607,119 B1 | 3/2017 | McHugh et al. |
| 9,742,451 B2 | 8/2017 | Yatsenko et al. |
| 9,762,208 B2 | 9/2017 | Xu et al. |
| 9,837,983 B2 | 12/2017 | Xu et al. |
| 9,893,713 B2 | 2/2018 | Yatsenko et al. |
| 10,355,667 B2 | 7/2019 | Takata |
| 10,931,253 B2 | 2/2021 | Ta et al. |
| 10,965,273 B2 | 3/2021 | Pang et al. |
| 2004/0119562 A1 | 6/2004 | Sakano |
| 2007/0030096 A1 | 2/2007 | Nishihara et al. |
| 2007/0046394 A1 | 3/2007 | Inoue et al. |
| 2008/0238572 A1 | 10/2008 | Funami et al. |
| 2011/0317318 A1 | 12/2011 | Fleming et al. |
| 2013/0115897 A1 | 5/2013 | Walker |
| 2014/0340173 A1 | 11/2014 | Burgener et al. |
| 2015/0236390 A1 | 8/2015 | Analui et al. |
| 2016/0119017 A1 | 4/2016 | Xu et al. |
| 2016/0268998 A1 | 9/2016 | Xu et al. |
| 2016/0294423 A1 | 10/2016 | Yatsenko et al. |
| 2016/0380608 A1 | 12/2016 | Ni et al. |
| 2017/0005639 A1 | 1/2017 | Khlat et al. |
| 2017/0093365 A1 | 3/2017 | Xu et al. |
| 2017/0093370 A1 | 3/2017 | Khlat et al. |
| 2017/0244382 A1 | 8/2017 | Lear |
| 2017/0302243 A1 | 10/2017 | Horita |
| 2017/0338801 A1 | 11/2017 | Hey-Shipton et al. |
| 2018/0076793 A1 | 3/2018 | Khlat et al. |
| 2018/0123547 A1 | 5/2018 | Kato et al. |
| 2018/0167054 A1 | 6/2018 | Berdy et al. |
| 2018/0198433 A1 | 7/2018 | Mori |
| 2018/0226949 A1 | 8/2018 | Caron et al. |
| 2018/0226952 A1 | 8/2018 | Tanaka et al. |
| 2019/0028085 A1 | 1/2019 | Kato et al. |
| 2019/0081613 A1 | 3/2019 | Nosaka |
| 2019/0123771 A1 | 4/2019 | Takeuchi et al. |
| 2019/0363692 A1 | 11/2019 | Nosaka |
| 2019/0363696 A1 | 11/2019 | Komatsu et al. |
| 2019/0379352 A1 | 12/2019 | Nosaka |
| 2020/0014370 A1 | 1/2020 | Matsubara et al. |
| 2020/0028479 A1 | 1/2020 | Ta et al. |
| 2020/0028481 A1 | 1/2020 | Sun et al. |
| 2020/0028489 A1 | 1/2020 | Ta et al. |
| 2020/0028492 A1 | 1/2020 | Ta et al. |
| 2020/0028493 A1 * | 1/2020 | Ta ......................... H03H 9/725 |
| 2020/0153412 A1 | 5/2020 | Nosaka |
| 2020/0212887 A1 | 7/2020 | Ozasa |
| 2020/0228094 A1 | 7/2020 | Kato |
| 2020/0228155 A1 | 7/2020 | Kido |
| 2021/0075399 A1 | 3/2021 | Schiek et al. |
| 2021/0119598 A1 | 4/2021 | Ta et al. |
| 2021/0184654 A1 | 6/2021 | Nakagawa et al. |
| 2021/0242853 A1 | 8/2021 | Mori |
| 2022/0006443 A1 | 1/2022 | Nishio |
| 2022/0123708 A1 | 4/2022 | Ta et al. |
| 2023/0074812 A1 | 3/2023 | Almalkawi |

FOREIGN PATENT DOCUMENTS

| | | |
|---|---|---|
| JP | 2010-206375 | 9/2010 |
| JP | 2013-098991 | 5/2013 |
| JP | 2018-093475 | 6/2018 |
| WO | WO 2016/117676 | 7/2016 |
| WO | WO 2016/093264 | 9/2017 |

OTHER PUBLICATIONS

U.S. Appl. No. 17/894,911, filed Aug. 24, 2022, Out-Of-Band Rejection For Acoustic-Wave Filters.

* cited by examiner

ACOUSTIC-WAVE LADDER FILTERS

CROSS REFERENCE TO PRIORITY APPLICATIONS

Any and all applications for which a foreign or domestic priority claim is identified in the Application Data Sheet as filed with the present application are hereby incorporated by reference under 37 C.F.R. § 1.57.

BACKGROUND

Technical Field

Embodiments of this disclosure relate to filters arranged to filter signals, such as radio frequency signals.

Description of Related Technology

Radio frequency (RF) communication systems can be used for transmitting and/or receiving signals of a wide range of frequencies.

For example, an RF communication system can be used to wirelessly communicate RF signals in a frequency range from about 30 kHz to about 300 GHz, such as in the range of about 410 megahertz (MHz) to about 7.125 gigahertz (GHz) for Fifth Generation (5G) cellular communications in Frequency Range 1 (FR1).

RF communication systems can include without limitation mobile phones, tablets, base stations, network access points, customer-premises equipment (CPE), laptops, and wearable electronics.

In certain applications, RF communications systems can process a plurality of RF signals concurrently. In these and other systems, bandpass filters with low in-band loss and high out-of-band rejection can be desirable.

SUMMARY OF CERTAIN INVENTIVE ASPECTS

In some aspects, the techniques described herein relate to a radio frequency acoustic filter configured to allow transmission within a passband. The filter can include first and second ports, a series acoustic resonator and a first inductor connected in series between the first port and a node, and a second inductor connected between the node and the second port. The first inductor and the second inductor can be mutually coupled. A shunt acoustic resonator can be connected between the node and a ground potential, and a third inductor can be connected between the first port and the second port.

The series acoustic resonator and the shunt acoustic resonator can be surface acoustic wave resonators or bulk acoustic wave resonators.

A mutual coupling factor between the first inductor and the second inductor can be tunable. One or more of the first, second, and third inductor can be tunable.

In some aspects, the techniques described herein relate to a radio frequency acoustic filter configured to allow transmission within a passband. The filter can include a first filter cell including first and second ports, and a series/shunt acoustic resonator pair connected between the first and second ports. The filter can further include a second filter cell including a third port connected to the second port, a fourth port, first, second, and third inductors, a second series acoustic resonator connected in series with the first inductor between the third port and a first node, and a second shunt acoustic resonator connected between the first node and a ground potential. The second inductor can be connected between the first node and the fourth port, the third inductor can be connected between the third port and the fourth port, and the first and second inductors can be mutually coupled.

In some aspects, the first filter cell does not include any mutually coupled inductors. In some aspects, the first filter cell does not include an inductor coupled in series between the first and second ports.

The filter further can further include a first filter port connected to the fourth port of the second filter cell, and a second filter port. The filter can be configured to allow transmission within a passband between the first filter port and the second filter port.

The filter can include one or more additional filter cells each including a series/shunt acoustic resonator pair, where the one or more additional filter cells may be connected in series between the second filter port and the first port of the first filter cell.

In some embodiments, some or all of the first filter cell and the one or more additional filter cells do not include more than one inductor.

The filter can include a third filter cell connected between the second filter port and the first port of the first filter cell. The third filter cell can include fifth and sixth ports, fourth, fifth, and sixth inductors, a third series resonator connected in series with the fourth inductor between the fifth port and a second node, and a third shunt acoustic resonator connected between the second node and the ground potential. The fifth inductor can be connected between the second node and the sixth port. The sixth inductor can be connected between the fifth port and the sixth port. The fourth and fifth inductors can be mutually coupled.

The filter can include one or more additional filter cells each including a series/shunt acoustic resonator pair. The one or more additional filter cells can be connected between the second filter port and the fifth port of the third filter cell. The fifth port of the third filter cell can be connected to the second filter port.

A mutual coupling factor between the first and second inductors can be tunable. One or more of the first, second, and third inductors can be tunable.

In some aspects, the techniques described herein relate to a radio frequency front end including a multiplexer including a first port, a plurality of second ports, and a plurality of first filters. Each of the plurality of first filters can be connected between the first port and a respective one of the second ports. Each of the plurality of filters can have at least one filter cell including third and fourth ports, a series acoustic resonator and a first inductor connected in series between the third port and a node, a second inductor connected between the node and the fourth port, a shunt acoustic resonator connected between the node and a ground potential, and a third inductor connected between the third port and the fourth port. The first inductor and the second inductor can be mutually coupled. The radio frequency front end can include one or more power amplifiers, where the multiplexer can be configured to multiplex transmit signals generated by the one or more power amplifiers.

The radio frequency front end can further include a demultiplexer including a plurality of second filters and a plurality of fifth ports. Each of the plurality of second filters can be connected between the first port and a respective one of the fifth ports. Each of the plurality of filters can have at least one filter cell including third and fourth ports, a series acoustic resonator and a first inductor connected in series between the third port and a node, a second inductor connected between the node and the fourth port, a shunt acoustic resonator connected between the node and a ground potential, and a third inductor connected between the third port and the fourth port. The first inductor and the second inductor can be mutually coupled. The demultiplexer can be configured to demultiplex one or more receive signals.

In some aspects, the techniques described herein relate to a mobile device including: an antenna; a multiplexer including a plurality of first filters, each of the plurality of first filters having at least one filter cell including a series acoustic resonator and a first inductor connected in series between a first port and a node, a second inductor connected between the node and a second port, a shunt acoustic resonator connected between the node and a ground potential, and a third inductor connected between the first port and the second port, the first inductor and the second inductors mutually coupled; and one or more power amplifiers, the multiplexer configured to multiplex transmit signals generated by the one or more power amplifiers.

In some aspects, the techniques described herein relate to a radio frequency filter configured to allow transmission within a passband. The filter can include first and second ports, a series acoustic resonator and a first inductor connected in series between the first port and a node, a second inductor connected between the node and the second port, a shunt acoustic resonator and a third inductor connected in series between the node and a ground potential, and a fourth inductor connected between the first port and the second port.

The series acoustic resonator and the shunt acoustic resonator can be surface acoustic wave or bulk acoustic wave resonators.

One or more of first, second, third, and fourth inductors can be tunable.

In some aspects, the techniques described herein relate to a radio frequency filter configured to allow transmission within a passband. The filter can include a first filter cell including first and second ports and a series/shunt acoustic resonator pair connected between the first and second ports. The filter can further include a second filter cell including a third port connected to the second port, a fourth port, first, second, third and fourth inductors, a second series acoustic resonator connected in series with the first inductor between the third port and a first node, a second inductor connected between the node and the fourth port, a second shunt acoustic resonator and the third inductor connected in series between the first node and a ground potential, and the fourth inductor connected between the third port and the fourth port.

The first filter cell in some embodiments does not include an inductor connected in series between an acoustic resonator and the ground potential. In some embodiments, the first filter cell does not include an inductor coupled in series between the first and second ports.

The radio frequency filter can include a first filter port connected to the fourth port of the second filter cell, and a second filter port. The radio frequency filter can be configured to allow transmission within a passband between the first filter port and the second filter port.

The filter can include one or more additional filter cells each including a series/shunt acoustic resonator pair, the one or more additional filter cells connected in series between the second filter port and the first port of the first filter cell.

According to some embodiments, the first filter cell and the one or more additional filter cells do not include more than one inductor.

In some aspects, the techniques described herein relate to a radio frequency filter wherein the radio frequency filter includes a second filter port and a third filter cell connected between the second filter port and the first port of the first filter cell, the third filter cell including fifth and sixth ports, fourth, fifth, sixth, and seventh inductors, a third series resonator connected in series with the fourth inductor between the fifth port and a second node, and a third shunt acoustic resonator and the fifth inductor connected in series between the second node and a ground potential. The sixth inductor can be connected between the second node and the sixth port. The seventh inductor can be connected between the fifth port and the sixth port.

The filter can include one or more additional filter cells that each can include a series/shunt acoustic resonator pair. The one or more additional filter cells can be connected between the second filter port and the fifth port of the third filter cell. The fifth port of the third filter cell can be connected to the second filter port.

A mutual coupling factor between the first and second inductors can be tunable. One or more of the first, second, and third inductors can be tunable.

In some aspects, the techniques described herein relate to a radio frequency front end including: a multiplexer including a plurality of first filters, a first port, and a plurality of second ports, each of the plurality of first filters connected between the first port and a respective one of the second ports. Each of the plurality of filters can have at least one filter cell including third and fourth ports, a series acoustic resonator and a first inductor connected in series between the third port and a node, a second inductor connected between the node and the fourth port, a third inductor and a shunt acoustic resonator connected in series between the node and a ground potential, and a fourth inductor connected between the third port and the fourth port; and one or more power amplifiers. The multiplexer can be configured to multiplex transmit signals generated by the one or more power amplifiers.

In some aspects, the techniques described herein relate to a radio frequency front end further including a demultiplexer including a plurality of second filters and a plurality of fifth ports. Each of the plurality of second filters can be connected between the first port and a respective one of the fifth ports. Each of the plurality of second filters can have at least one filter cell including third and fourth ports. A series acoustic resonator and a first inductor can be connected in series between the first port and a node. A second inductor can be connected between the node and the fourth port. A third inductor and a shunt acoustic resonator can be connected in series between the node and a ground potential. A fourth inductor can be connected between the third port and the fourth port. The demultiplexer can be configured to demultiplex one or more receive signals.

In some aspects, the techniques described herein relate to a mobile device including: an antenna; a multiplexer including a plurality of first filters, each of the plurality of first filters having at least one filter cell including a series acoustic resonator and a first inductor connected in series between a first port and a node, a second inductor connected between the node and a second port, a shunt acoustic resonator and a third inductor connected between the node and a ground potential, and a fourth inductor connected in series between the first port and the second port; and one or more power amplifiers. The multiplexer can be configured to multiplex transmit signals generated by the one or more power amplifiers.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Overview

Figure 1:
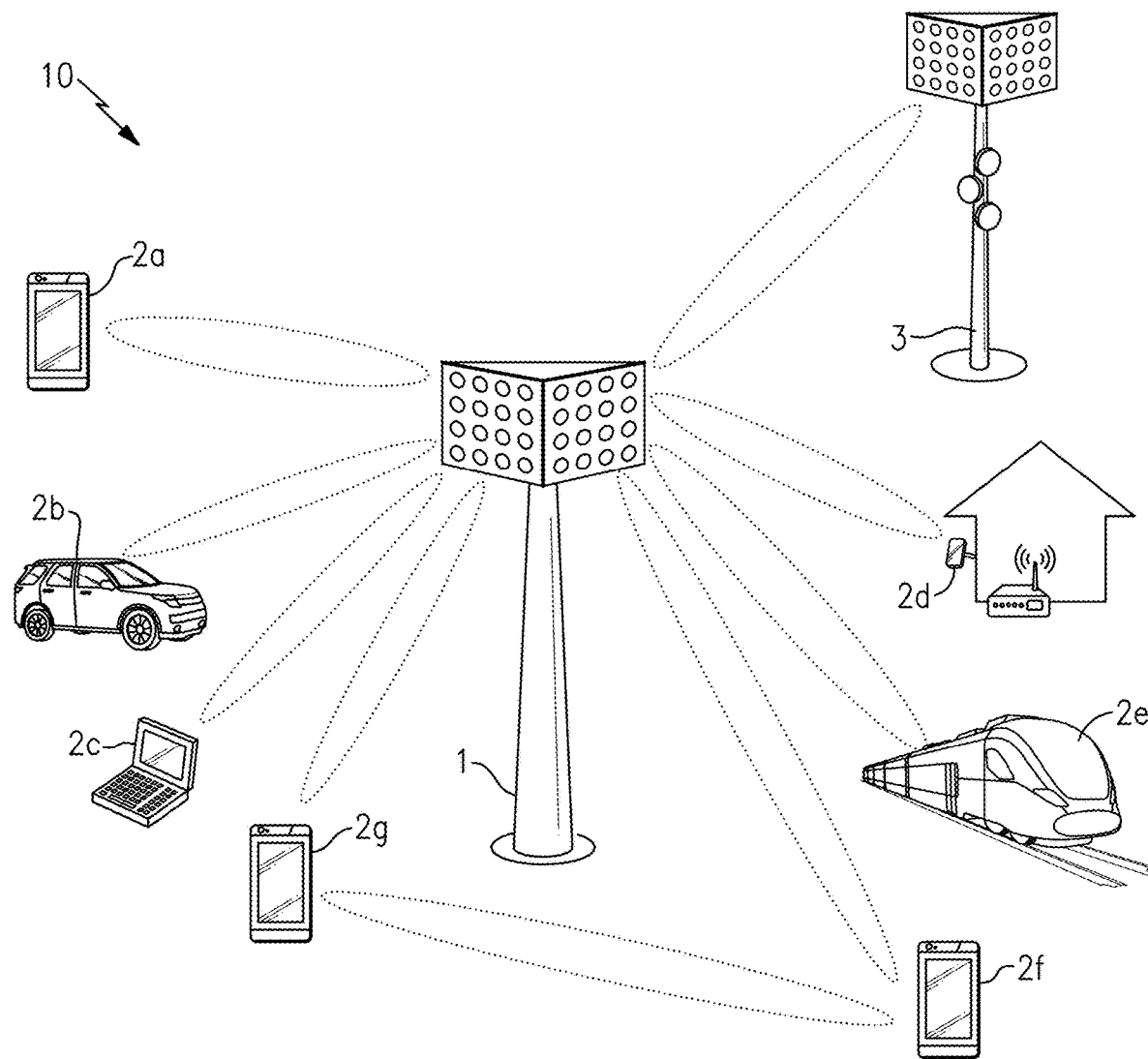
FIG. 1 is a schematic diagram of one example of a communication network.

The following description of certain embodiments presents various descriptions of specific embodiments. However, the innovations described herein can be embodied in a multitude of different ways, for example, as defined and covered by the claims.

In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High-Power User Equipment (HPUE).

3GPP introduced Phase 1 of fifth generation (5G) technology in Release 15, and is currently in the process of developing Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

Communication Network

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

A peak data rate of a communication link (for instance, between a base station and a user device) depends on a variety of factors. For example, peak data rate can be affected by channel bandwidth, modulation order, a number of component carriers, and/or a number of antennas used for communications.

For instance, in certain implementations, a data rate of a communication link can be about equal to $M*B*\log_2(1+S/N)$, where M is the number of communication channels, B is the channel bandwidth, and S/N is the signal-to-noise ratio (SNR).

Accordingly, data rate of a communication link can be increased by increasing the number of communication channels (for instance, transmitting and receiving using multiple antennas), using wider bandwidth (for instance, by aggregating carriers), and/or improving SNR (for instance, by increasing transmit power and/or improving receiver sensitivity).

5G NR communication systems can employ a wide variety of techniques for enhancing data rate and/or communication performance.

Carrier Aggregation

Improvement on network data rates was possible under the 3GPP LTE-Advanced by introducing the concept of carrier aggregation (CA). Under CA, a user equipment (UE) is simultaneously linked to more than one channel and thereby more resource blocks (RBs) are assigned to a single user. While CA applied to the downlink (DL-CA) bands enhances data transfer from the network to the UE, CA on the uplink (UL-CA) bands improves data transfer from the UE to the network. Typically, DL data traffic is often higher than the UL traffic; therefore, implementations of CA have focused on DL-CA.

Figure 2A:
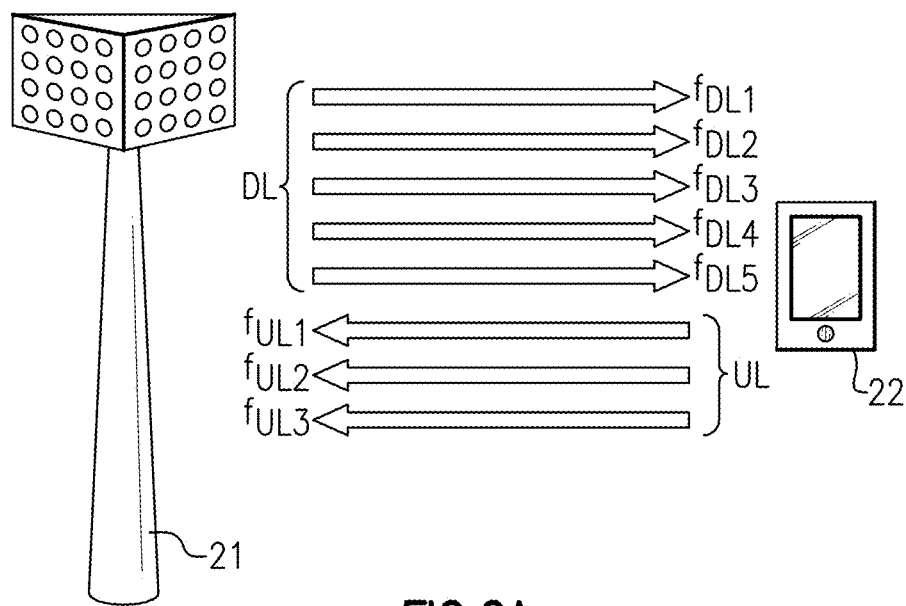
FIG. 2A is a schematic diagram of one example of a communication link that uses carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations. Carrier aggregation can present challenges for designing bandpass filters with high out-of-band rejection to isolate the frequency carriers. Filters disclosed herein can be implemented to support carrier aggregation applications.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
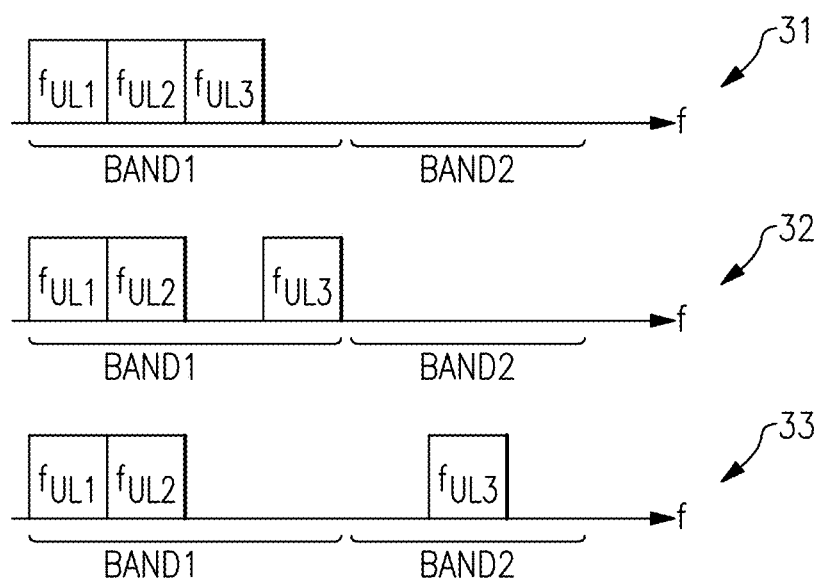
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
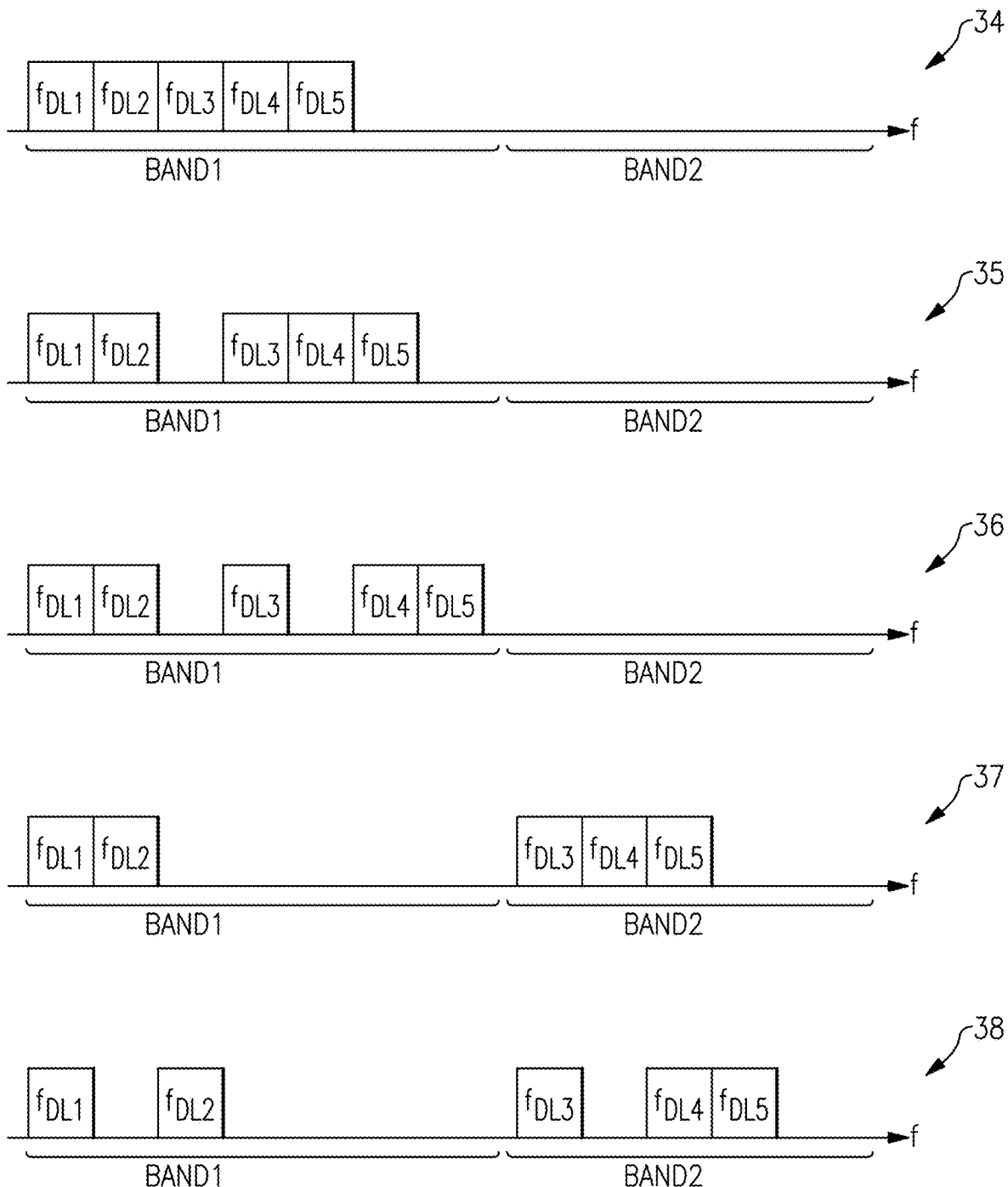
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as Wi-Fi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid Wi-Fi users and/or to coexist with Wi-Fi users. Enhanced license assisted access (eLAA) refers to an evolution of LAA that aggregates licensed and unlicensed spectrum for both downlink and uplink.

Application of Bandpass Filters in Carrier Aggregated Wireless Systems

In order to implement the carrier aggregation schemes described above, the communication devices and systems (e.g., wireless receivers) should be equipped with circuits that can combine component carriers before transmission (e.g., to an antenna) and/or separate them from a received signal. In some cases, this can be achieved using frequency multiplexers and frequency demultiplexers composed of bandpass filters having passbands (e.g., non-overlapping passbands) near the frequencies of the corresponding component carriers. For example, when CA is applied to a down-link (DL-CA), a frequency division duplexed (FDD) mobile device may transmit at one frequency while simultaneously receive at a different frequency. Such mobile device may use duplexers or multiplexers where a transmitting filter passes the transmitted data, while providing sufficient rejection (typically 60 dB) in the receive band to prevent de-sensing the receiver. On the other side, the receive filter passes the received data, while providing sufficient rejection in the transmit band to avoid the transmitted power from blocking the receiver. Bandpass filter may be used for separating carrier components in various carrier aggregation scenarios (e.g., those shown in FIG. 2C). In particular for separating a component carrier from component carriers distributed over a wide frequency range, a bandpass filter should provide sufficient out-of-band (OOB) rejection over a wide out-of-band frequency range to avoid crosstalk.

Filter designs disclosed herein may be used in multiplexers and demultiplexers usable in communication systems and devices functioning based on CA scheme. For example, bandpass filter designs disclosed herein may be used to realize bandpass filters with low in-band loss and high level of rejection at OOB frequencies. Additionally, the disclosed designs may be implemented by modifying an existing filter by adding a rejection enhancing network comprising of few elements (e.g., inductors) without the need to modify or change the components of the original filter.

While embodiments may be discussed with reference to bandpass filters used in multiplexers and demultiplexers, any suitable principles and advantages of the filters disclosed herein can be used to provide any suitable out-of-band rejection.

Figure 3A:
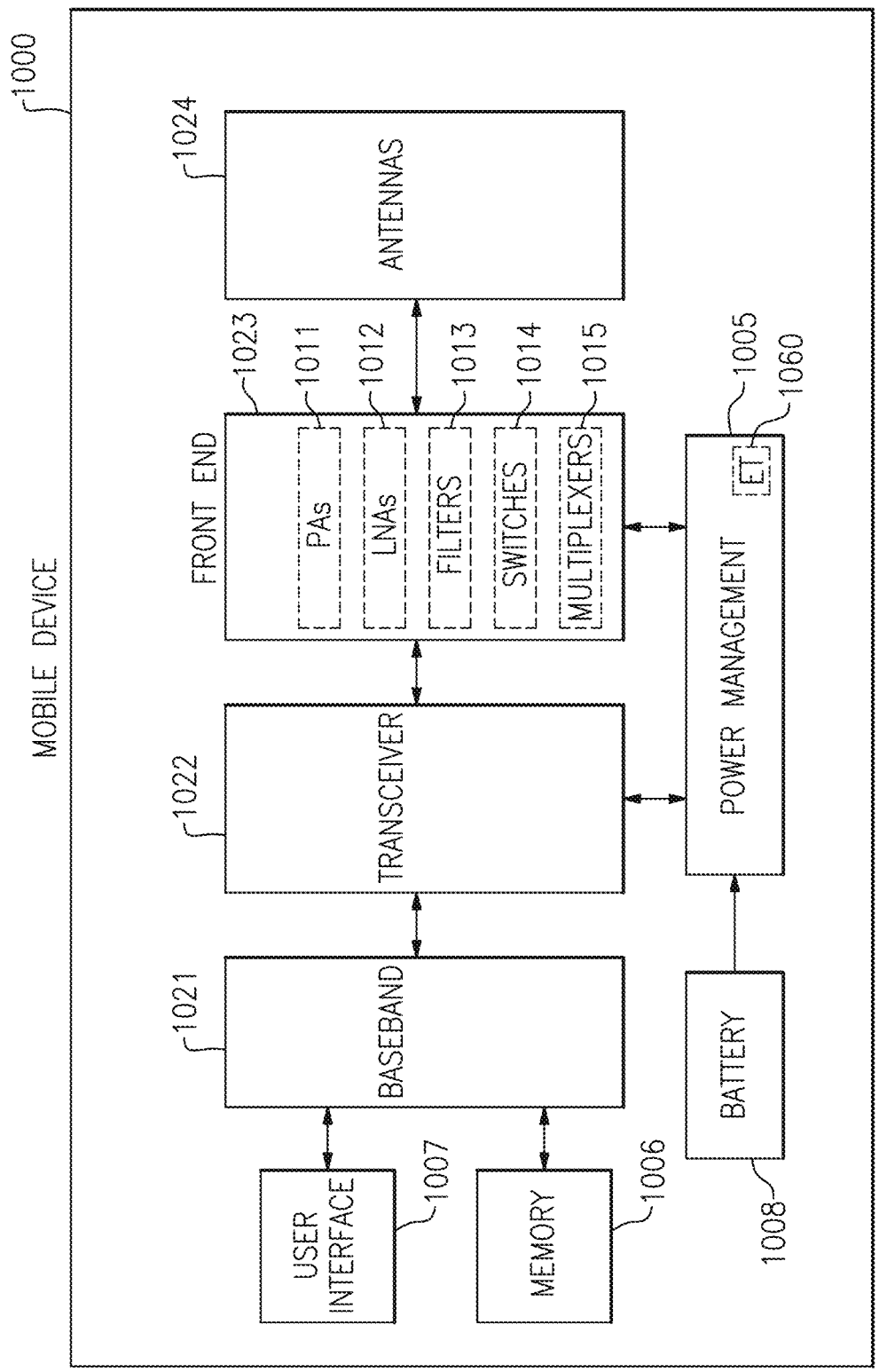
FIG. 3A illustrates an example of a mobile device.

FIG. 3A is a schematic diagram of one example of a mobile device 1000. The mobile device 1000 includes a baseband system 1021, a transceiver 1022, a front end system 1023, antennas 1024, a power management system 1005, a memory 1006, a user interface 1007, and a battery 1008.

The mobile device 1000 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 1022 generates RF signals for transmission and processes incoming RF signals received from the antennas 1024. It will be understood that various functionalities associated with the transmission and receiving of RF signals can be achieved by one or more components that are collectively represented in FIG. 1 as the transceiver 1022. In one example, separate components (for instance, separate circuits or dies) can be provided for handling certain types of RF signals.

The front end system 1023 aids is conditioning signals transmitted to and/or received from the antennas 1024. In the illustrated embodiment, the front end system 1023 includes power amplifiers (PAs) 1011, low noise amplifiers (LNAs) 1012, filters 1013, switches 1014, and multiplexers 1015 (e.g., duplexers). However, other implementations are possible.

For example, the front end system 1023 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 1000 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band and/or in different bands.

The antennas 1024 can include antennas used for a wide variety of types of communications. For example, the antennas 1024 can include antennas associated transmitting and/or receiving signals associated with a wide variety of frequencies and communications standards.

In certain implementations, the antennas 1024 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 1000 can operate with beamforming in certain implementations. For example, the front end system 1023 can include phase shifters having variable phase controlled by the transceiver 1022. Additionally, the phase shifters are controlled to provide beam formation and directivity for transmission and/or reception of signals using the antennas 1024. For example, in the context of signal transmission, the phases of the transmit signals provided to the antennas 1024 are controlled such that radiated signals from the antennas 1024 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 1024 from a particular direction. In certain implementations, the antennas 1024 include one or more arrays of antenna elements to enhance beamforming.

The baseband system 1021 is coupled to the user interface 1007 to facilitate processing of various user input and output (I/O), such as voice and data. The baseband system 1021 provides the transceiver 1022 with digital representations of transmit signals, which the transceiver 1022 processes to generate RF signals for transmission. The baseband system 1021 also processes digital representations of received signals provided by the transceiver 1022. As shown in FIG. 3A, the baseband system 1021 is coupled to the memory 1006 of facilitate operation of the mobile device 1000.

The memory 1006 can be used for a wide variety of purposes, such as storing data and/or instructions to facilitate the operation of the mobile device 1000 and/or to provide storage of user information.

The power management system 1005 provides a number of power management functions of the mobile device 1000. The power management system 1005 of FIG. 1 includes an envelope tracker 1060, which can be implemented in accordance with one or more features of the present disclosure. As shown in FIG. 3A, the power management system 1005 receives a battery voltage form the battery 1008. The battery 1008 can be any suitable battery for use in the mobile device 1000, including, for example, a lithium-ion battery.

The mobile device 1000 of FIG. 1 illustrates one example of an RF system that can include bandpass (BP) filters implemented in accordance with one or more features of the present disclosure. For example, the front end system 1023 may include multiplexers and demultiplexers composed of BP filters (e.g., BP filters with enhanced OOB rejection). However, the teachings herein are applicable to RF systems implemented in a wide variety of ways.

In some embodiments, the mobile device 1000 may be connected to a wireless network that uses carrier aggregation (CA) to increase the bit rate supported by a communication channel. For example, the wireless network may use a 3GPP LTE-advanced carrier aggregation scheme. In these embodiments, the front end system 1023 may include a multiplexer to generate an uplink transmit signal (Tx) by combining component carriers and a demultiplexer to separate component carriers from a received downlink signal (Rx). In some examples, the multiplexer and the demultiplexer may each comprise a plurality of bandpass filters with center frequencies near or substantially equal to frequencies of the component carriers. Such BP filters must provide high level of isolation between different carrier components not only within a single frequency division duplexed (FDD) band but also across the different FDD LTE bands used in CA.

The configurations and filters used for designing multiplexers/demultiplexer should take into the requirements of a CA based mobile device, for example, low in-band loss, high inter-band isolation, high level of OOB rejection, small size, and low intermodulation distortion. One of the most commonly used configurations for multiplexing/demultiplexing is the manifold-coupled configuration (e.g., star junction configuration) that support low insertion loss and enables a high level of miniaturization. In a star-junction configuration all component carriers are combined at a common junction and therefore resulting in a more even power distribution. The star junction may be used to combine any number of component carriers independent of their bandwidth and frequency separation.

Figure 3B:
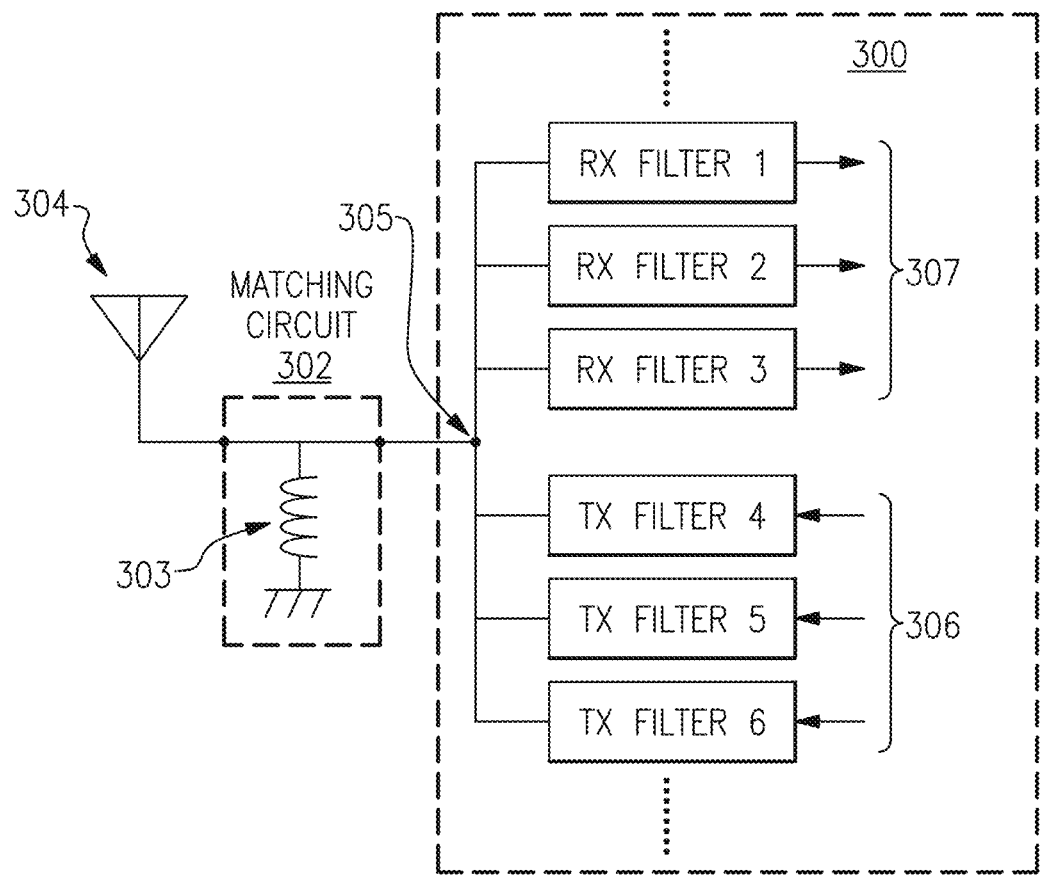
FIG. 3B illustrates an example of a star junction multiplexer.

FIG. 3B is a schematic diagram of an example of a front end frequency multiplexing sub-system 300 (e.g., the frequency multiplexing sub-system of the front end system 1023) that includes a multiplexer 306 and a demultiplexer 307 with a star junction configuration. Also shown in FIG. 3A are the antenna 304 and a matching circuit 302 that couples the antenna 304 to the frequency multiplexing sub-system 300. The multiplexer 306 and the demultiplexer 307 each include three bandpass filters. The matching circuit 302 may be configured to match the impedance of the antenna 304 to the impedance of the common node of the antenna node 305 frequency multiplexing sub-system 300. In the example shown, the matching circuit 302 includes a single shunt inductor 303 (also known as susceptance-annulling inductor) that provides nearly constant input admittance at the input of the multiplexer 300, typically, the antenna side of the multiplexer.

Bandpass filters used in a multiplexer 306 and demultiplexer 307 used of sub-system, 300 need to present high out-of-band (OOB) rejection at all bands that are being multiplexed while maintaining low in-band loss. It is, however, challenging to obtain a broad OOB rejection to cover all bands of interest while preserving minimum in-band loss. There is always a trade-off between a filter's in-band performance (e.g., bandwidth and in-band insertion loss) and its OOB rejection level (also referred to as rejection floor) as well as the filter's bandwidth and the filter OOB rejection. The self-isolation and cross-isolation between the multiplexed filters depend on the rejection floor provided by each filter at the other bands' frequency of interest and are important parameters to consider when designing multiplexers that support carrier aggregation (CA).

Filters Comprised of Acoustic Wave Resonators

As mentioned above, in order to support efficient CA based wireless communication, the filters in the multiplexing sub-system of the front end system 1023 should have a very low insertion loss, sharp out-of-band transmission roll-off, and high isolation between carrier components used in for CA. Additionally, the small size of the modern mobile devices limits the size the footprint of the filters that be used in the frequency multiplexing subsystem 300. As described above, a multiplexer (e.g., the frequency multiplexer sub-system 300) can include a plurality of band pass filters coupled together at a common node (e.g., node 305). Insertion loss of a filter in the multiplexer is typically degraded compared to standalone filters due to loading from other filters of the multiplexer. Bandpass filters that use acoustic wave (AW) resonators to provide low insertion loss within a pass band and high OOB rejection, can be used as building blocks of such multiplexers to improve their performance.

Surface acoustic wave (SAW) and bulk acoustic wave (BAW) filters that use piezoelectric acoustic-wave (AW) resonators, are well-known filters that can be used to support carrier aggregation in a small form factor. Piezoelectric acoustic-wave resonators offer several advantages compared to other electronic resonators (e.g., RLC resonators) including but not limited to: 1) large unloaded Q-factor, 2) precise frequency control, 3) relatively low frequency variation over temperature, 4) small size at gigahertz frequencies, 5) compatibility with conventional photolithography and silicon IC fabrication processes, 6) electro-mechanical tunability, and 7) low cost mass production cost.

Typically SAW filters comprise metallic interdigital transducers (IDTs) and reflection gratings deposited on a piezoelectric substrate. A microwave input signal applied to the input IDT stimulates an acoustic wave that propagate along the SAW surface, and generates a microwave output signal upon reaching the output IDT. The operational frequency of SAW filter is determined by the separation of IDT fingers. A BAW resonator includes a piezoelectric slab sandwiched between metallic electrodes. When a voltage is applied across the electrodes, an acoustic wave is generated via piezoelectric effect and propagates in the slab (e.g., along a thickness of the slab). The resonance frequency of a BAW resonator is determined by a dimension (e.g., thickness) of the slab. BAW resonators can achieve relatively high out-of-band suppression and low insertion loss when used as a filter building block (e.g., a bandpass filter), and can be particularly suitable as building blocks of frequency multiplexers used in mobile devices.

Surface acoustic wave (SAW) and bulk acoustic wave (BAW) technologies are both capable of achieving relatively high out-of-band impedance values. In some cases, a SAW filter may be fabricated on a multilayer piezoelectric substrate (VIPS) SAW filter. In such cases, the SAW filter (herein referred to MPS SAW filter) may exhibit lower insertion loss as compared to SAW filters fabricate on single layer substrate. Certain high performance BAW filters can outperform SAW filters in terms of out-of-band impedance magnitude over a wider frequency span. At the same time, BAW filters can be suited to filter signals having frequencies up to about 10 gigahertz (GHz). BAW filters can achieve relatively low insertion loss and desirable rejection of adjacent frequency bands. On the other hand, SAW filters can be lower cost than BAW filters. SAW filters include, for example, multilayer piezoelectric substrate (VIPS) SAW filters, temperature compensated SAW (TCSAW) filters, and non-temperature compensated SAW filters. However, SAW filters can encounter difficulty filtering signals at relatively high frequencies, such as frequencies above about 2.7 GHz, in certain applications. Given these differences in technology, SAW filters can be used for filtering relatively lower frequencies than BAW filters in a variety of applications and thereby save costs.

Figure 4A:
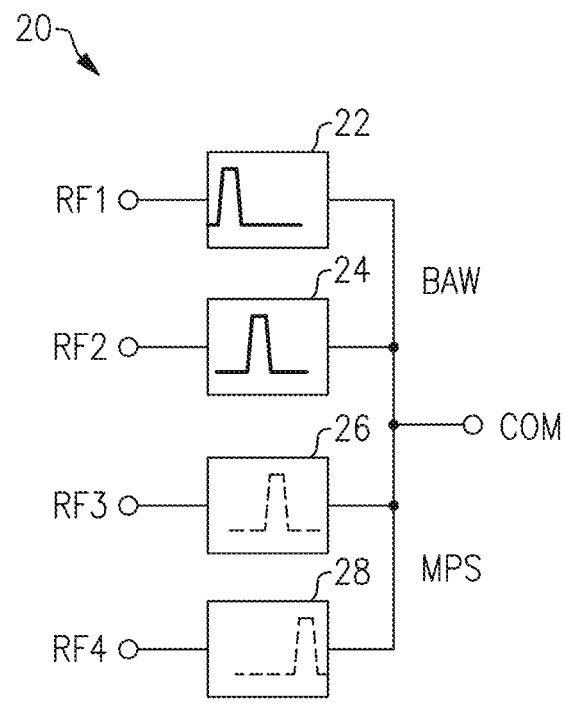
FIG. 4A is a schematic block diagram of a quadplexer according to an embodiment.

FIG. 4A is a schematic block diagram of a quadplexer 20 according to an embodiment. In some cases, the quadplexer 20 may be used in the front end system 1023 of the mobile device 1000 as a multiplexer (or a demultiplexer) to enable the usage of the mobile device 1000 in a wireless network that uses 4-band CA scheme. The quadplexer 20 includes four bandpass (BP) filters 22, 24, 26, 28 coupled to a common node COM. A first BP filter 22 is coupled between a first RF node RF1 and the common node COM. A second BP filter 24 is coupled between a second RF node RF2 and the common node COM. A third BP filter 26 is coupled between a first RF node RF3 and the common node COM. A fourth BP filter 28 is coupled between a second RF node RF4 and the common node COM. In various embodiments the BP filter 22, 24, 26, or 28 can be acoustic wave (AW) filters (e.g., BAW filter or SAW filter).

Figure 4B:
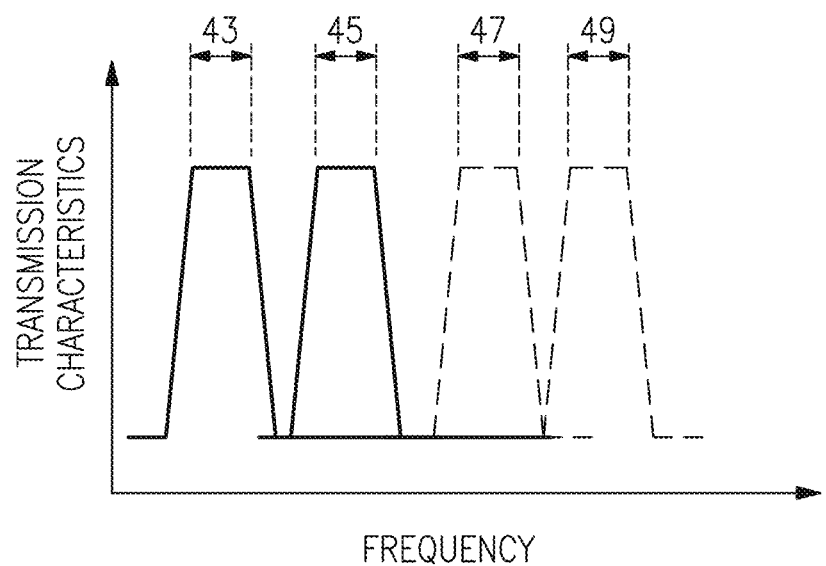
FIG. 4B is a graph of transmission characteristics over frequency for filters of the quadplexer of FIG. 2A.

FIG. 4B is a graph of transmission characteristics over frequency for filters of the quadplexer 20 of FIG. 4A. FIG. 4B illustrates a first pass band 43 of the first BP filter, a second pass band 45 of the second BP filter 24, a third pass band 47 of the third BP filter 26, and a fourth pass band 49 of the fourth BP filter 28. The BP filters 22, 24, 26, and 28 can have respective stop bands above and below their pass bands 43, 45, 47 and 49. As shown in FIG. 4B, the passband of a BP filter of the quadplexer 20 may overlap with the stop bands of the other three filters to enable selection of a single band out of four bands used in a 4-band CA network. As such a larger out of band attenuation reduces interband cross-talk and may improve the quality of the received or transmitted signals.

As mentioned above, low insertion loss can be difficult to achieve in a multiplexer that includes a plurality of filters. In some cases, this can be due to loading effect of the multiple filters contacted to a single junction. To reduce the loading effect in the multiplexer 20 a judicious combination of BAW and MPS SAW filters may be employed. For example, a multiplexer with a BAW filter having the lowest pass band of all filters of the multiplexer and an MPS SAW filter having the highest pass band of all filters of the multiplexer can achieve low loading loss and low insertion loss for the multiplexer. Other types of SAW filters (e.g., a temperature compensated SAW filter) can be implemented in place of the MPS SAW filter and achieve relatively low insertion loss for filters in a multiplexer in certain instances. In some cases, the first AW filter 22 and the second AW filter 24 are BAW filters and the third AW filter 26 and the fourth AW filter 28 are MPS SAW filters. In an embodiment, the acoustic wave resonators of the first BAW filter 22 and the second BAW filter 24 consist of FBARs. The BAW filters 22 and 24 can have respective stop bands above their pass bands 43 and 45. The BAW filters 22 and 24 can be formed of type II BAW resonators that have spurious modes below their respective resonant frequencies. Accordingly, spurious modes of the BAW filters 22 and 24 can be outside of the pass bands 47 and 49 of the MPS SAW filters 26 and 28, respectively. The MPS SAW filters 26 and 28 can have respective stop bands below their pass bands 47 and 49. The MPS filters 26 and 28 can be formed of MPS SAW resonators that have spurious modes above their respective resonant frequencies. Accordingly, spurious modes of the MPS filters 26 and 28 can be outside of the pass bands 43 and 45 of the BAW filters 22 and 24, respectively.

In some implementations, a BP filter used in a multiplexer (or demultiplexers) may include two or more AW resonators. For example, a BP filter (e.g., a ladder filter) may comprise a plurality of cascaded stages or cascaded unit cells where each unit cell comprises two or more AW resonators. In some such implementations, each unit cell of the BP filter may additionally include inductors and/or capacitors. In some cases, the additional inductors may improve impedance matching between the BP filter and the antenna 304 and/or a circuit connected to the BP filter. In some cases, the additional inductors may improve the out of band attenuation of the BP filter. For example, a rejection enhancing network comprising one or more inductors may be added to a unit cell of a ladder filter (e.g., a unit cell comprising a pair of AW resonators) to increase OOB rejection of in the resulting frequency response.

In some cases, one or more stages or unit cells of a BP ladder filter include one or more RLC resonator instead of or in addition to AW resonators. In various implementations, other types of electronic or electromechanical resonators (e.g., MEM resonators) may be used in a unit cell of a BP ladder filter.

Figure 5:
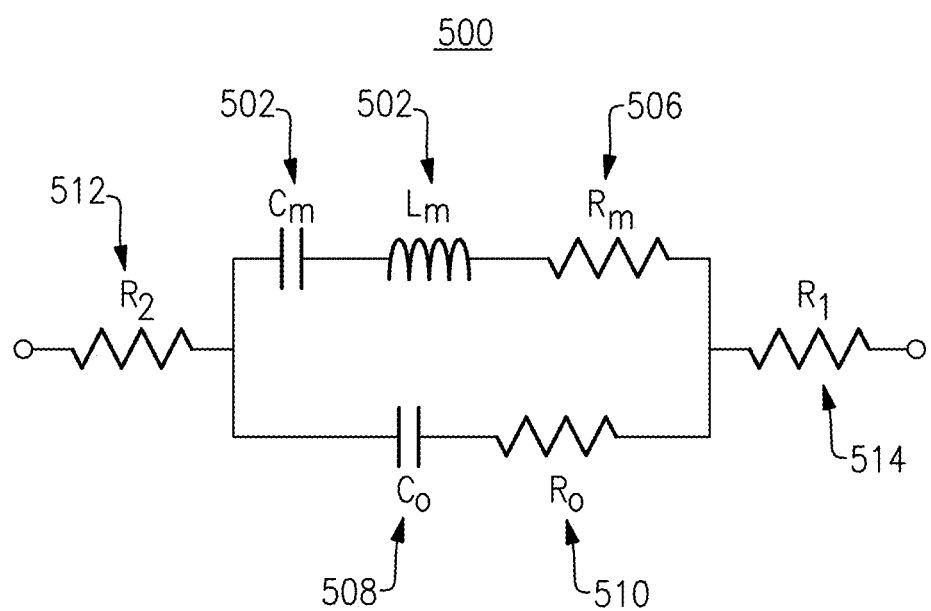
FIG. 5 illustrates is a modified Butterworth Van Dyke (mBVD) circuit model for an acoustic wave (AW) resonator.

The spectral response of an AW resonator may be modeled using an equivalent RLC circuit. FIG. 5 is a schematic diagram of an example equivalent RLC circuit 500 for an AW resonator. The example equivalent circuit model 500 is also known as the modified Butterworth-Van-Dyke (mBVD) circuit model. The mBVD circuit model comprises a first resistor R1 514, that is connected to a second resistor R2 512 via an RLC branch (also known as motional branch), and an RC branch (also known as static branch) where the RLC and RC branches are connected in parallel between the first resistor R1 514 and the second resistor R2 512. The RLC branch include a first capacitor Cm 502 and first inductor Lm 504 and first resistor Rm 506 connected in series. The RC branch include a second capacitor C0 508 and second resistor R0 510 connected in series. The equivalent circuit 500 may be used to simulate and optimize the frequency response of the disclosed filters, and study the impact of selecting different parameter values on the corresponding frequency response. In some embodiments, the equivalent circuit 500 may be used to replace one or more AW resonators in a bandpass filter with lumped elements (e.g., individual resistors, capacitors and conductors)

Figure 6A:
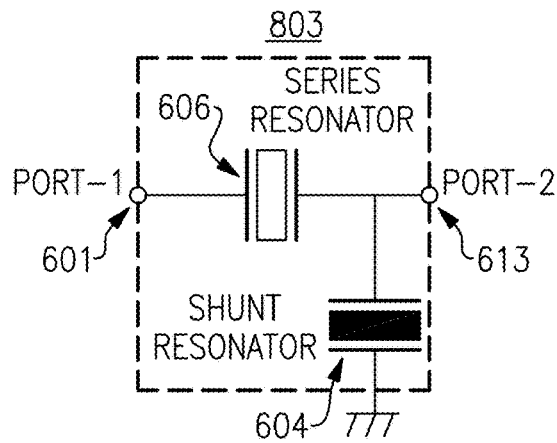
FIG. 6A illustrates an example unit cell filter that includes a series and a shunt AW resonator.

AW resonators may be combined in various configurations to provide multi-pole bandpass filters. In some cases, a bandpass filter may include one or more unit cell filters, herein referred to as unit cells, where each unit cell is a bandpass filter comprising two AW resonators. FIG. 6A illustrates an example unit cell 803 that includes two AW resonators, a series and a shunt AW resonator. The unit cell 803 can be referred to as a half-ladder filter, and can serve as a building block element for filters. This configuration forms a passband filter, for example, when the series resonator has a higher resonance frequency than the shunt resonator. Ladder filters may use multiple unit cells (or half-ladder stages) to provide a frequency response having a higher roll-off slope and certain in-band and out-of-band characteristics. In some cases, the frequency response of a multi-stage filter (e.g., a ladder filter) may be tailored by arranging the poles within its passband, and the zeros outside its passband (e.g., poles and zeros of the corresponding transfer function in the complex plane).

The unit cell 803 is arranged to filter a radio frequency signal propagating between a first port 601 (port-1) and a second port 613 (port-2). The unit cell 803 can be a bandpass filter. As illustrated, the unit cell 803 includes a series AW resonator 606 connected between port-1 601 and port-2 613, and a shunt AW resonator 604 connected to the first AW resonator 606 and the second port 613 in one end, and the ground potential in the other end, via a T-junction. In some cases, port-1 601 may be an input port and port-2 613 may be an output port. In other cases, port-1 601 may be an output port and port-2 613 may be an input port. The electrical characteristics (e.g., resonant frequency, impedance, and the like) of the series AW resonator 606 and the shunt AW resonator 604 may set a frequency response of the unit cell 803, including what frequencies are passed and where notches, dips or zeros are present in a frequency response.

Figure 6B:
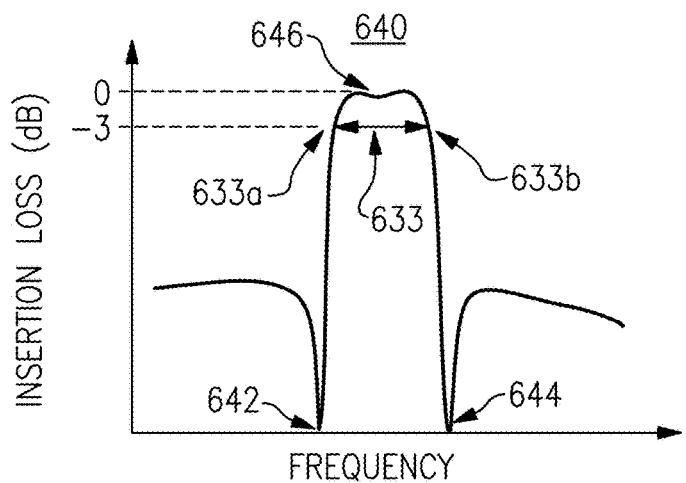
FIG. 6B illustrates an example bandpass frequency response.

FIG. 6B illustrates an example bandpass frequency response 640. In the example shown, the bandpass frequency response is represented by the insertion loss spectrum 640. Insertion loss is the ratio between electromagnetic power inserted to port-1 601 and electromagnetic power received from port-2 613 expressed in decibel (dB). As such insertion loss quantifies the attenuation of an RF signal propagating between port-1 601 and port-2 613 or vice versa. In some cases, the insertion loss may be expressed as $20 \times \log_{10}(S_{21})$ where $S_{21}$ is the scattering parameter (voltage transmission coefficient) between port-1 602 and port-2 613.

The insertion loss spectrum 640 includes a passband 646 limited by a low-frequency passband (PB) notch or PB-notch 642 and a high-frequency passband (PB) or PB-notch 644. A bandwidth 633 of the passband 646 may be limited by a low frequency bound 633a and a high frequency bound 633b at which the insertion loss is reduced from a peak value or a value at the center of passband by changes 50% (e.g., from 0 to −3 dB). The insertion loss spectrum 640 indicates that radio frequency signals having frequencies within the bandwidth 633 experience lower loss compared to the radio frequency signals having frequencies outside of the bandwidth 633. In some cases, a minimum or an average attenuation of signals having frequencies lower than the low-frequency PB-notch 642 or larger than the high-frequency PB-notch 644, may be referred to as out-of-band rejection or OOB rejection. OOB rejection may correspond to an attenuation outside the pass band, e.g., below the low-frequency PB-notch 642 and above than the high frequency notch 644, outside the passband 646, or outside the bandwidth 633 of the passband 646.

A rate at which the insertion loss (e.g., the absolute value of the insertion loss) increases when the frequency of the RF signal varies from the low frequency bound 633a of the bandwidth 633 to the low-frequency PB-Notch 642 of the passband 646 may be referred to as a roll-off slope of the low frequency edge of the passband 646. Accordingly, a rate at which the insertion loss (e.g., the absolute value of the insertion loss) increases when the frequency of the RF signal varies from the high-frequency bound 633b of the bandwidth 633 to the high-frequency BP-notch 644 of the passband 646 may be referred to as a roll-off slope of the high-frequency edge of the passband 646. A magnitude of a roll-off slope may be expressed as dB/octave or dB/decade.

In some cases, the insertion loss spectrum of the unit cell 803 may be similar to insertion loss spectrum 640 or comprise one or more features described with respect the insertion loss spectrum 640.

As mentioned above, a bandpass (BP) filter may include a plurality of unit cells. In some cases, such BP filter may have a ladder topology where the unit cells are connected in series between an input port and an output port of the resulting ladder filter. In some examples, a unit cell of a ladder filter may be the unit cell 803. In various embodiments, including more unit cells in a BP filter may improve the roll-off slope, bandwidth or other RF characteristics of the BP filter. In some examples, a roll-off of the passband associated with a bandpass filter comprising multiple cascaded unit cells, may scale with number of unit cells included in the bandpass filter. An insertion loss within the bandwidth of the ladder filter (also known as in-band insertion loss) may increase proportional to the number of unit cells included in the ladder filter.

Figure 6C:
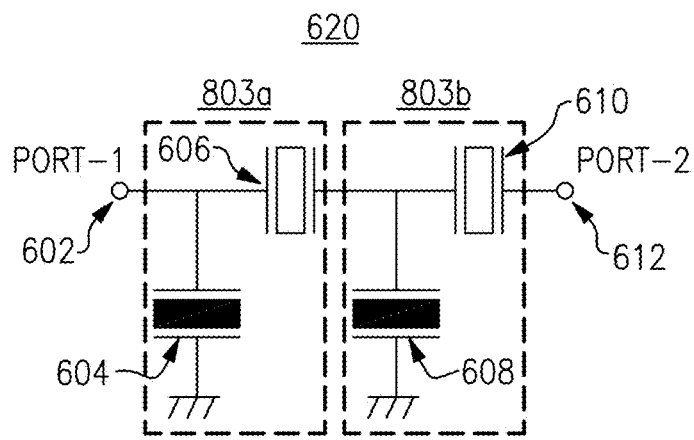
FIG. 6C illustrates an example of a two-stage or two-cell bandpass ladder filter.

FIG. 6C illustrates an example of a two-stage or two-cell BP ladder filter 620 arranged to filter a radio frequency signal propagating between a first port 602 (port-1) and a second port 612 (port-2) of the ladder filter 620. The ladder filter 620 comprises a first unit cell 803a and a second unit cell 803b connected in series between port-1 602 and port-2 612. The first unit cell 803a comprises a first series AW resonator 606 and a first shunt AW resonator 604. The second unit cell 803b comprises a second series AW resonator 610 and a second shunt AW resonator 608. In some cases, the frequency response of the BP filter 620 may be determined by the electrical and electromechanical characteristics (e.g., resonant frequencies) of the AW resonators in unit cell 803a and unit cell 803b. Accordingly, in some cases, the electrical and electromechanical characteristics of the AW resonators in unit cell 803a and unit cell 803b may be selected based on a desired frequency response of the BP filter 620.

Figure 6D:
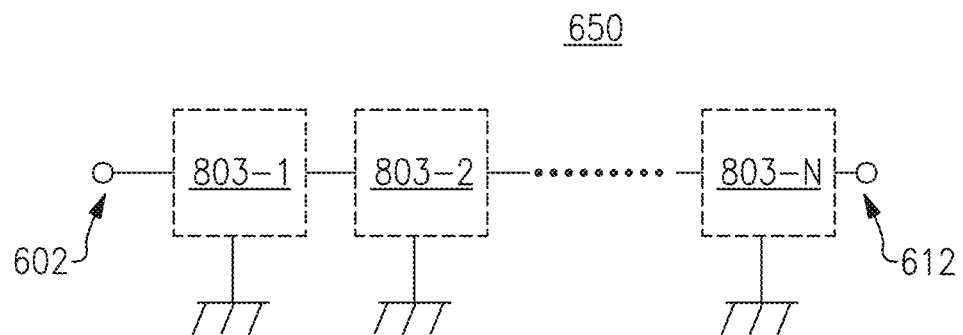
FIG. 6D illustrates an example of a multi-cell bandpass ladder filter.

FIG. 6D illustrates another example of BP ladder filter 650 arranged to filter a radio frequency signal propagating between a first port 602 (port-1) and a second port 612 (port-2) of the ladder filter 520. The ladder filter 650 comprises N cascaded unit cells 803-1 to 803-N connected in series between port-1 602 and port-2 612. In some cases, a unit cell of the N unit cells may be similar to unit cell 803 and comprise a series AW resonator and a shunt AW resonator. However, an electrical characteristic (e.g., a resonant frequency) of the AW resonators may vary from one unit cell to another unit cell. For example, a BP filter may comprise five unit cells and ten AW resonators (each unit cell having a series AW resonator and a shunt AW resonator), where a resonant frequency of an AW resonator of the ten AW resonators differs from the resonant frequencies of other AW resonators.

In some cases, a unit cell of the N unit cells may include other elements (e.g., capacitors, inductors, resistors, and the like) in addition to AW resonators. In some cases, a unit cell of the N unit cells may not include an AW resonator. For example, a unit cell may include one or more RLC resonators. The total number of unit cells N, and the electrical characteristics of the AW resonators in a unit cell of the N unit cells may be selected based on a desired frequency response of the BP filter 650. In some embodiments, a unit cell of the N unit cells may include different types and/or number of elements. In some embodiments, a subset or all unit cells of the BP filter 650 may have the same types and/or number of elements.

When unit cells of a ladder filter (e.g., ladder filter 650) comprise AW resonators, two conditions can help minimize in-band insertion loss: 1) the series AW resonator having lower impedance than the shunt AW resonator within the ladder filter bandwidth; and 2) the shunt AW resonator having lower resonant frequency than the series AW resonator. In some cases, increasing the series to shunt capacitance ratio improves the passband matching (resulting in reduced insertion loss within the passband) at the expense of the overall attenuation floor of the filter at the OOB frequencies and vice versa. As such achieving high rejection at the OOB frequencies while maintaining low insertion loss in the in-band frequencies can be challenging.

An insertion loss spectrum of the BP filter 620 or BP filter 650 may be similar to the insertion loss spectrum 640 or have one or more features (e.g., a passband, a roll-off slope, a bandwidth, a OOB rejection and the like) described with respect to the insertion loss spectrum 640. In some cases, the insertion loss spectrum of the BP filter 620 has a larger roll-off slope compared to the unit cell 803. In some cases, the roll-off slope of the BP filter 650 may increase by increasing a number of cascaded unit cells (N).

As mentioned above, multiplexers (or demultiplexers) used to support wireless communication based on CA, require BP filters with large OOB rejection. In many cases, when multiple BP filters are used in a multiplexer (e.g., the multiplexer shown in FIG. 4B), the level of attenuation provided by a BP filter may not be sufficiently large for the corresponding out of band frequencies that may overlap with the adjacent passbands of the other BPs in the multiplexer. For example, the BP ladder filters composed of unit cells similar to unit cell 803 may not provide the level of OOB required to support communication based on CA. In some embodiments, one or more unit cells of the BP filter 620 or BP filter 650 may be modified to improve the OOB rejection or partial OOB rejection. For example, a unit cell of the ladder filter 650 may be reconfigured to include a rejection enhancing network comprising one or more inductors.

In some instances, a BP ladder AW filter may incorporate inductor or capacitor elements connected in series or in parallel to the shunt or series AW resonators. These elements provide the following benefits: (1) extending the filter's bandwidth, and/or (2) placing narrowband transmission zeroes (notches) at the desired OOB rejection frequencies.

In some cases, a unit cell may be modified by adding an inductor (referred to as ground inductor) between the shunt AW resonator 604 and the ground potential. A ground inductor can be an inductor that provides an inductive path to ground potential at a node in a circuit, at an input port and/or at an output port. For example, a unit cell of the N unit cells in the BP filter 650 may include a ground inductor between the shunt AW resonator and the ground potential. In some cases, the ground inductors introduce additional notches (transmission zeros) at one or more OOB frequencies resulting in larger OOB rejection or at least larger partial OOB rejection. However, notches (e.g., narrowband notches) provided by the ground inductors at one or more OOB frequencies may not provide sufficient attenuation over a broad range OOB frequencies that overlap with adjacent passbands (e.g., at the lower frequency side of the passband).

In some cases, the ground inductors are selectively connected together in order to further improve OOB rejection (or partial OOB rejection). The selective connection between the ground inductors may cancel some of the electromagnetic parasitic effects, for example, associated with packaging or multichip integration.

While, adding more ground inductors may improve the OOB rejection over a wider frequency range, the in-band insertion loss associated with each inductor added may result in a tradeoff between OOB rejection and in-band insertion loss. Further, the above mentioned modifications may reduce the bandwidth of the resulting BP filter. In addition to reduced bandwidth and increased in-band insertion loss, including ground inductors in ladder filters may increase a size of the filter in particular for filters that include large number of unit cells.

In some cases, ground inductors may be added to the input port and output port of a ladder filter to improve impedance matching between the ladder filter and the circuits or devices connected to the input and output ports of the ladder filter.

Figure 7:
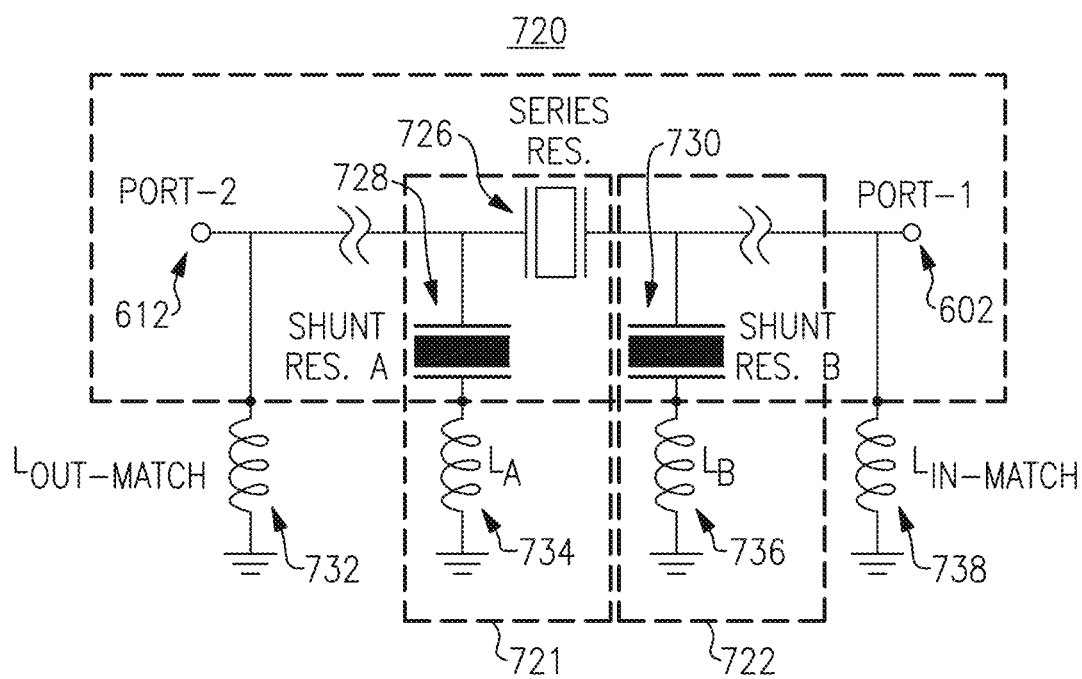
FIG. 7 illustrates an example of a ladder filter with ground inductors.

FIG. 7 illustrates a BP ladder filter 720 that filters a radio frequency signal propagating between a first port 602 (port-1) and a second port 612 (port-2). The ladder filter 720 is a bandpass filter having modified unit cells. The ladder filter 720 includes two different unit cells connected in series between port-1 602 and port-2 612. A first unit cell 721 is a modified version of the unit cell 803 and a second unit cell 722 is a shunt branch comprising a shunt AW resonator 730 and a first ground inductor 736 connected in series between port-2 612 and the ground potential. The modified unit cell 721 includes a series AW resonator 726, a shunt AW resonator 728 and a second ground inductor 734 connected in series with the shunt AW resonator 728 between port-2 612 and the ground potential. The ladder filter 720 also includes an input ground inductor 738 connected to port-1 602 and an output ground inductor 732 connected the port-2 612. The input ground inductor 738 may improve impedance matching between port-1 602 and a circuit/device (e.g., an antenna or an amplifier) that provides an input RF signal to port-1 602, and the output ground inductor 732 may improve impedance matching between port-2 612 and a circuit/device (e.g., an antenna or an amplifier) that receives the output RF signal from port-2 612.

The first ground inductor 736 and the second ground inductor 734 increase the OOB rejection of the BP ladder filter 720 compared a similar ladder filter having shunt AW resonators directly connected to ground. However, in some applications (e.g., frequency multiplexing/demultiplexing in mobile devices and front end systems), the increased OOB rejection of the BP ladder filter 702 may be limited to a narrow frequency OOB range, and/or may not be sufficient, e.g., to support carrier aggregation.

Ladder Filters with Enhanced Unit Cells

As described above, BP filters used in mobile communication systems require high levels of attenuation at the contiguous operating bands. This is to ensure low susceptibility to potential power leakage from nearby transmitting bands; a fact that is crucial in the design of manifold multiplexers where rejections from one filter into others are inevitable to meet the system-level performance requirements.

In some embodiments, the OOB rejection of a BP ladder filter may be increased by including an enhanced unit cell in the chain of cascaded unit cells that form a ladder filter. For example, with reference to FIG. 6D, the last unit cell 803-N of the N unit cells included in the BP ladder filter 650 may be an enhanced unit cell. In some implementations, the OOB rejection of the BP ladder filter 650 may be improved if at least one of the unit cells is an enhanced unit cell.

An enhanced unit cell may include one or more inductive elements in addition to the series and shunt AW resonators included in the unit cell 803. In some cases, an enhanced unit cell may include one or more inductive and capacitive elements in addition to the series and shunt AW resonators included in the unit cell 803.

In various embodiments, an enhanced unit cell may improve the OOB rejection of the ladder filter 650 by introducing a low-frequency additional notch in OOB frequencies below the passband of the filter 650, and a high-frequency additional notch above the passband of the filter 650. In some cases, one or both additional notches introduced by the enhanced unit cell may be wideband notches resulting an improvement of OOB rejection over wide range of OOB frequencies. In some cases, unlike the modified unit cells described above (e.g., unit cells modified by adding a ground inductor), an enhanced unit cell may improve the OOB rejection of the ladder filter 650 without significantly decreasing the bandwidth of the corresponding passband. In some cases, unlike the modified unit cells described above (e.g., unit cells modified by adding aground inductor to a shunt AW resonator), an enhanced unit cell may improve the OOB rejection of the ladder filter 650 without significantly increasing the in-band insertion loss. In a preferred implementation, the enhanced unit cell may include a rejection enhancing network comprising a pair of mutually coupled inductors and a third inductor as a linkage network between the series and shunt AW resonators in the unit cell 803. In addition to improving the OOB rejection of the BP filter, this network may increase the bandwidth of the filter and provide additional degrees of freedoms designing the enhanced unit cell.

In some cases, values of the inductances of each additional inductor and/or the mutual coupling between the two mutually coupled inductors may be used as new degrees of freedom to tailor the performance (e.g., the frequency response characteristics) of the unit cell and corresponding BP filter. For example, one or more of these degrees of freedom may be used to design BP ladder filters with broad OOB rejection or control the bandwidth of a BP ladder filter. In some examples, one or more of these degrees of freedom may allow post fabrication adjustment of the corresponding BP ladder filter. Additionally, in some systems, these degrees of freedom may be used to dynamically control one or more characteristics of frequency response of the BP ladder filter.

In one embodiment, an enhanced unit cell may be realized by a pair of mutually coupled inductors and one uncoupled parallel inductor linking the shunt AW resonator to a successive series AW resonator. Adding these inductors may improve the OOB rejection of unit cell and the ladder filter that includes these inductors in one or more of its unit cells.

For RF microelectronic devices operating at megahertz and gigahertz frequencies, networks based on lumped elements can be helpful for developing circuits with advance frequency characteristics (e.g., phasing elements for supporting the operation of CA multiplexers, matching networks, and for providing transmission zeros to attenuate specific frequency bands). From this perspective, the rejection enhancing network described above, may provide enhanced OOB rejection over a broad frequency range using a small number of lumped elements (e.g., three inductors) while maintaining low in-band loss or even improving the in-band loss at the passband edges by increasing the filter's bandwidth (e.g., by increasing the effective AW resonators coupling).

Figure 8A:
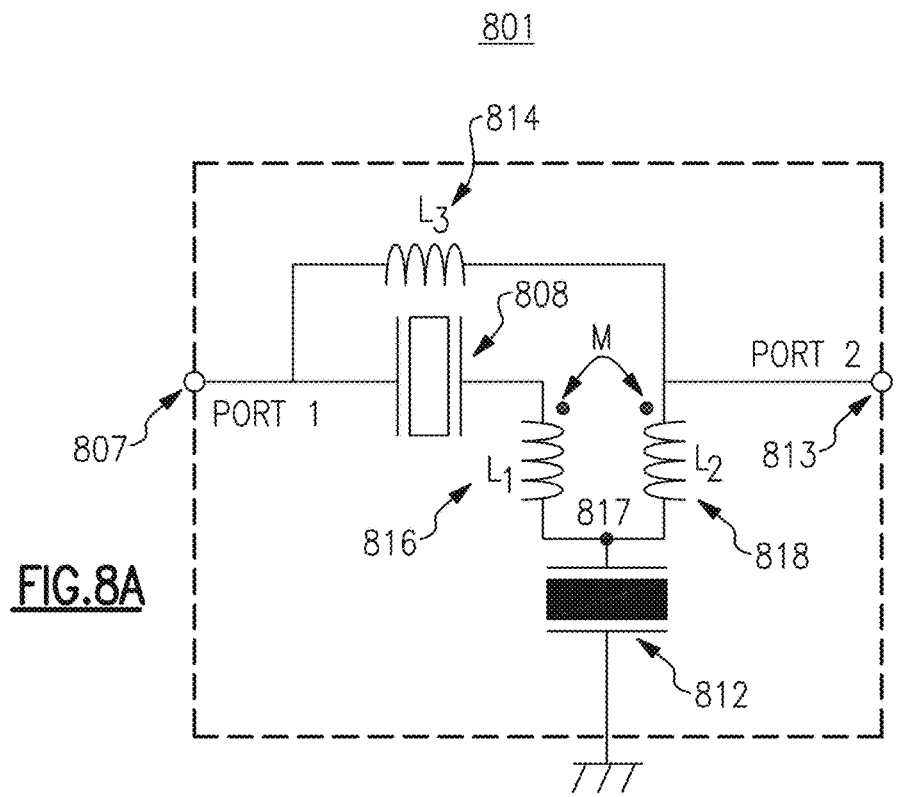
FIG. 8A illustrates and example of an enhanced unit cell having a rejection enhancing network.

FIG. 8A is a schematic diagram of an example enhanced unit cell 801 according to an embodiment. The enhanced unit cell 801 is arranged to filter a radio frequency signal propagating between a first port 807 (port-1) and a second port 813 (port-2). In some cases, the port-1 807 may be an input port and the port-2 813 may be an output port. In some other cases, the port-2 813 may be an input port and the port-1 807 may be an input port. The enhanced cell 801 can be a bandpass filter with improved OOB rejection compared to the unit cell 803. The enhanced unit cell 801 includes: a series AW resonator 808 and a first inductor 816 having an inductance $L_1$ connected in series between the port-1 807 and a node 817, a shunt AW resonator 812 connected between the node 817 and the ground potential, a second inductor 818 having an inductance $L_2$ connected between the node 817 and the port-2 813, and a third inductor 814 having an inductance $L_3$ connected between port-1 807 and port-2 813. The first inductor 816 and the second inductor 818 are mutually coupled with a mutual inductance M. The mutual inductance M can be positive or negative. The mutual inductance M may be also expressed as a k √L1L2, where k is the coupling factor between the first inductor 816 and the second inductor 818. Mutual coupling may also be referred to as magnetic coupling or mutual inductive coupling.

Inductors of the enhanced unit cell 801 and/or one or more other enhanced unit cells disclosed herein can include any suitable number and/or types of inductors, such as one or more surface mount technology (SMT) inductors or surface mount devices (SMDs), one or more coils on and/or embedded in a substrate (e.g., a laminate substrate), one or more on die inductors (e.g., one or more inductors on the same die as the AW filter or on the same die as a switch in a tunable impedance circuit), one or more integrated passive device (IPD) inductors, the like or any suitable combination thereof.

In some embodiments, the enhanced unit cell 801 may be an enhanced version of the unit cell 803 that includes a rejection enhancing network comprising the mutually coupled inductors L1 and L2, and the decoupled inductor L3. Including the rejection enhancing network in the unit cell 803 replaces the T-junction that connects the series AW resonator 606, the shunt AW resonator 604 and port-2 613, with the mutually coupled inductors L1 and L2 and adds an inductive path between port-1 601 and port-2 613 via the third inductor L3.

Advantageously, the network of three inductors, two of which are mutually coupled, may improve the OOB rejection of the unit cell 801 compared to the unit cell 803, for example, by adding additional notches (e.g., broadband notches) that increase the attenuation of at least a portion of OOB frequencies both above and below the passband. In some cases, the unit cell 803 and the enhanced unit cell 801 may have substantially the same bandwidth 633 and in-band insertion loss.

Figure 8B:
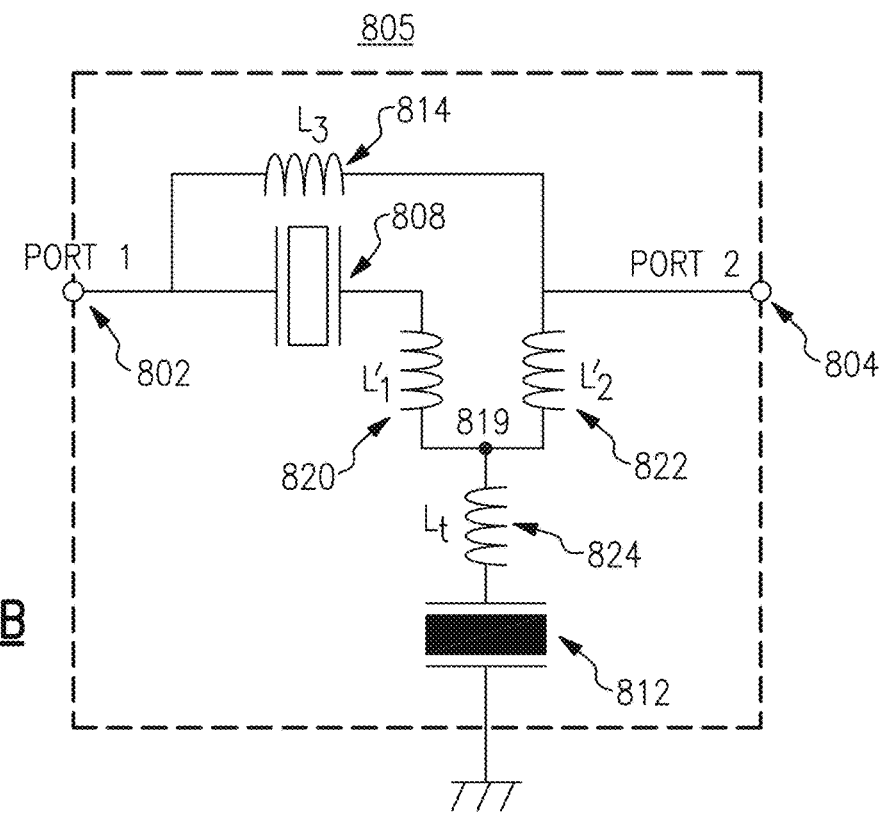
FIG. 8B illustrates another example of an enhanced unit cell having a second type of rejection enhancing network.

In some embodiments, an enhanced unit cell may include four independent or uncoupled inductors. FIG. 8B illustrates an example of an enhanced unit cell 805 with four uncoupled inductors. The enhanced unit cell 805 has a bandpass frequency response and is arranged to filter a radio frequency signal propagating between a first port 802 (port-1) and a second port 804 (port-2). The enhanced unit cell 805, includes: a series AW resonator 808 and first inductor 820 having an inductance $L'_1$ connected in series between port-1 802 and a node 819, a second inductor 822 having an inductance $L'_2$ connected between the node 819 and port-2 804, a shunt AW resonator 812, a third inductor 824 having an inductance Lt connected between the node 819 and the ground potential, and a fourth inductor 824 having an inductance $L_3$ connected between port-1 802 and port-2 804.

In certain configurations, the enhanced unit cell 805 and the enhanced unit cell 801 may have substantially the same frequency response. For example, the enhanced unit cell 805 and the enhanced unit cell 801 may be configured to have substantially the same bandwidth, OOB rejection and/or in-band insertion loss. In some cases, the unit cell 805 and the unit cell 801 may have substantially the same functionality and the two unit cells could be used interchangeably. In applications where mutual inductance can be included (e.g. printed, on-die, or IPD coils configured as transformers), the unit cell 801 has the advantage of requiring fewer elements. The mutual coupling of the inductors in 801 is substituted by an additional series inductor in 805. As such, when mutual coupling isn't achievable (e.g. with SMD inductors), unit cell 805 could be used as a substitute.

In some examples, the enhanced unit cell 805 may be an enhanced version of the unit cell 803 that includes a second type of rejection enhancing network comprising the four decoupled inductors $L'_1$, $L'_2$, Lt, and $L_3$. Referring to FIGS. 6A and 8B, the second type of rejection enhancing network effectively replaces the original T-junction between the series AW resonator 606, the shunt AW resonator 604 and port-2 613, with an inductive T-junction formed by three inductors $L'_1$, $L'_2$, and Lt and adds an inductive path between the port-1 601 and port-2 613 via the third inductor $L_3$.

In some implementations, the rejection enhancement networks described above also increase the bandwidth of the unit cell or a ladder filter that uses such enhanced unit cell. An increased bandwidth may improve the in-band loss at the filter's passband edges. Having larger bandwidth may also allow the use of piezoelectric material with lower coupling coefficient as the structural material for the corresponding AW filters; as such the AW resonator can be made thinner resulting in higher static capacitance. Having a high static capacitance means that a smaller size resonator may be used to achieve a given impedance.

The rejection enhancing networks described above may provide additional degrees of freedom by virtue of the additional linkage between the series and shunt AW resonator branches via the inductors. By judiciously tailoring these additional degrees of freedom, these networks provide wider OOB rejection over a wider frequency range compared to the conventional AW ladder filter designs that utilize single ground inductors on the individual shunt resonators.

In some implementations, the AW resonators in the unit cell 803, the enhanced unit cell 801, and/or the enhanced unit cell 805, may be replaced by other types of electrical or electromechanical resonators (e.g., RLC resonators). For example, one or both AW resonators in the unit cell 803, the enhanced unit cell 801, and/or the enhanced unit cell 805, may be replaced by the equivalent circuit 500 by choosing the appropriate values for $R_1$, $R_2$, $R_0$, $R_m$, $C_m$ and $L_m$.

The implementation of the rejection enhancing network used in the enhanced unit cell 801 that includes three inductor elements (a pair of coupled inductors plus one uncoupled inductor), and the rejection enhancing network used in the enhanced unit cell 805 that includes four uncoupled inductors, can be relatively simple. Including enhanced unit cells that include any of the aforementioned rejection enhancing networks, may not increase the fabrication cost, complexity, or the size of the resulting filter compared to a cascaded BP filter that does not include an enhanced cell. In some examples, these inductors are added to a BP filter is after the filter is fabricated (e.g., as additional surface mounted components). For example, a laminate that supports fabrication of bandpass filters and combining them as multiplexers, may also support printed inductors as embedded coils within the laminate metal layers, as on-chip devices, or as surface mount devices (SMDs). As such, in some implementations, the proposed network may be added to an existing filter without the need to change the original design of the filter. In some cases, the implementation can be as simple as changing the layout on the laminate which is much cheaper than conducting the change on the filter die. Also, laminate fabrication has faster fabrication turn-times when compared to AW filters fabrication times. Moreover, adding one or more rejection enhancing networks may not affect the in-band insertion loss of a BP ladder filter while increasing OOB rejection. In contrast, in the conventional approach described above where OOB rejection is increased by connecting ground inductors in series with the AW resonators of a BP ladder filter, the in-band insertion loss may be increased. Hence, the proposed solution can be thought of as an agnostic solution (i.e., can be applied to a filter after being designed and manufactured) applicable for any selected filter in a multiplexer design.

In some implementations, a unit cell may be enhanced using the rejection enhancing network used in the enhanced unit cell 801 or the second type of rejection enhancing network used in the enhanced unit cell 805. In some cases, a type of rejection enhancing network included in an enhanced unit cell may be determined by the constraints imposed by the fabrication process associated with adding or including the rejection enhancing network in a unit cell or a ladder filter. For example, in some cases fabrication and/or integration of coupled inductors may be challenging while in other cases adding four inductors to a unit cell may increase a size of the filter beyond a threshold size constrained by available space on a die, chip, or circuit board. In some cases, the inductances of the inductors in a rejection enhancing network may be tailored with more accuracy compared to the mutual inductance between a pair of inductors; in such cases it may be advantageous to use the rejection enhancing network used in enhanced unit cell 805.

Figure 8C:
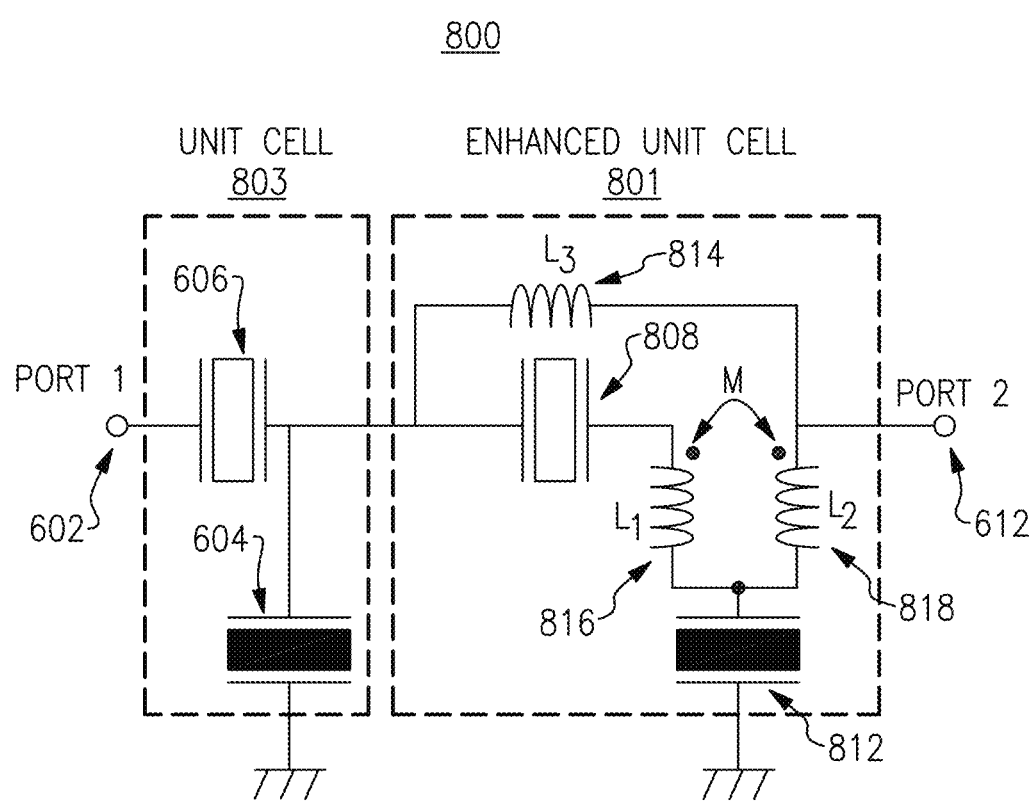
FIG. 8C illustrates a two-cell ladder filter that has an enhanced unit cell.

In some embodiments, the enhanced unit cell 801 may be combined with one or more unit cells 803 to provide a multipole filter response with a larger role-off slope in addition to the improved OOB rejection. FIG. 8C illustrates a BP ladder filter 800 comprising a unit cell 803 and an enhanced unit cell 801 connected in series between a first port 602 (port-1) and a second port 612 (port-2). The BP ladder filter 800 has a bandpass frequency response and is arranged to filter a radio frequency signal propagating between the first port 602 (port-1) and the second port 604 (port-2). The ladder filter 800 may have a passband, bandwidth and in-band insertion loss substantially identical to the passband, bandwidth and in-band insertion loss of the ladder filter 620. However, the OOB rejection of the ladder filer 800 may be larger than that of the ladder filter 620.

Figure 9A:
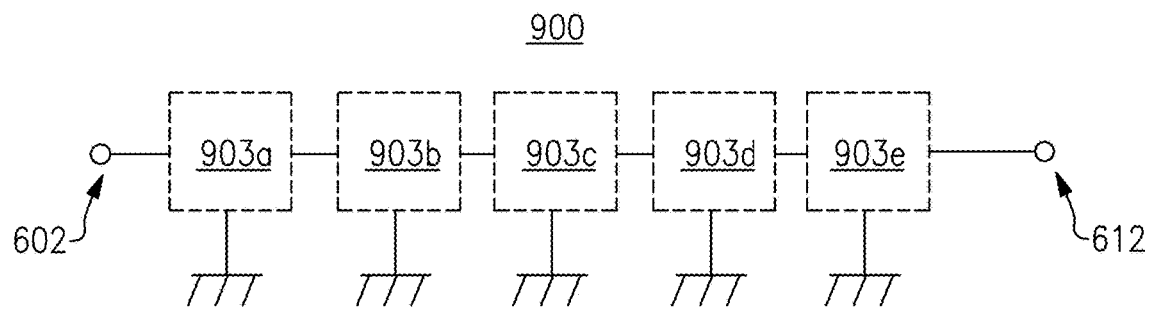
FIG. 9A illustrates a 5-cell ladder filter.

FIG. 9A illustrates a BP ladder filter 900 that comprises five cascaded unit cells 903a, 903b, 903c, 903d, and 903e. In some examples, unit cells 903a, 903b, 903c, 903d, and 903e are similar to unit cell 803 of FIGS. 6A and 8C. Each unit cell of the unit cells 903a, 903b, 903c, 903d and 903e has a series and a shunt AW resonator. The resonant frequencies of the shunt and/or the series AW resonator of each unit cell may be different from those of the other unit cells. The BP ladder filter 900 has a bandpass frequency response and is arranged to filter a radio frequency signal propagating between a first port 602 (port-1) and a second port 612 (port-2). In some examples, unit cells 903a, 903b, 903c, 903d, and 903e are other types of unit cells different from the unit cell 803 (e.g., unit cells comprising RLC elements or different arrangements of AW resonators). In some such examples, unit cells 903a, 903b, 903c, 903d and 903e are similar to one another (e.g., having the same type and number of elements and same arrangement of elements). The resonant frequencies of the series and shunt AW resonators in the unit cells of the BP ladder filter 900 may be selected based on a desired passband of the BP ladder filter 900.

Figure 9B:
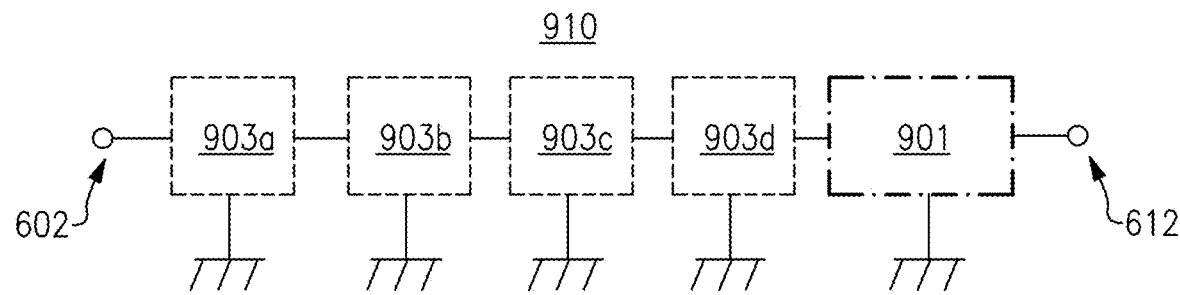
FIG. 9B illustrates a 5-cell ladder filter that has an enhanced unit cell.

FIG. 9B illustrates another example of a BP ladder filter 910 that also has five cascaded unit cells but includes an enhanced unit cell. The ladder filter 910 comprises five cascaded unit cells 903a, 903b, 903c, 903d, and 901 where the first four unit cells are similar to unit cells 903a, 903b, 903c, 903d of the ladder filter 900 (having same topology, same elements, and same number of elements), and the last unit cell 901 is an enhanced unit cell (e.g., the enhanced unit cell 801, or the enhanced unit cell 805).

In some embodiments, the last unit cell 901 is similar to the enhanced unit cell 801 having a pair of mutually coupled inductors and an independent inductor in addition to the series and shunt AW resonators. The resonant frequencies of the series AW resonator 808 and shunt AW resonator 812 in the unit cell 901, may be selected based on a center frequency and a bandwidth of a desired bandpass frequency response for the BP filter 910. The inductance $L_1$, $L_2$ and $L_3$ of the first inductor 816, the second inductor 818 and the third inductor 814 in the enhanced unit cell 901, and the mutual inductance M between the first inductor 816, the second inductor 818 may be selected based on the desired bandwidth and OOB rejection of the desired bandpass frequency response for the BP filter 910.

In some other embodiments, the last unit cell 901 is similar to the enhanced unit cell 805 having four independent inductors in addition to the series and shunt AW resonators. The resonant frequencies of the series AW resonator 808 and shunt AW resonator 812 in the unit cell 901, may be selected based on a center frequency and a bandwidth of a desired bandpass frequency response for the BP filter 910. The inductance $L_1'$, $L_2'$, $L_3$ and Lt of the first inductor 820, the second inductor 822, the third inductor 814, and the fourth inductor 824 in the enhanced unit cell 901 may be selected based on the desired bandwidth and OOB rejection of the desired bandpass frequency response for the BP filter 910.

Figure 9C:
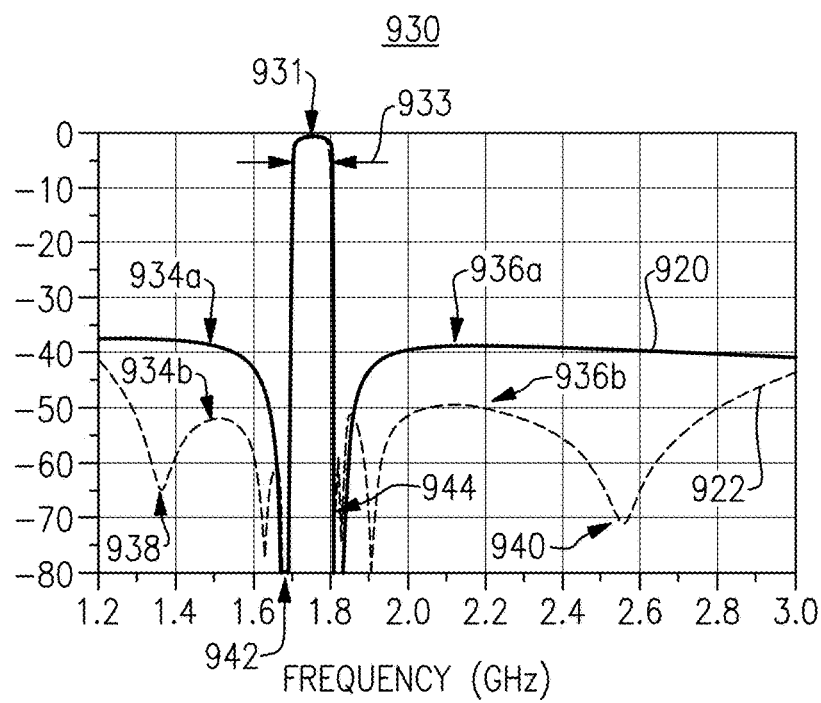
FIG. 9C illustrates the simulated insertion loss spectrum for the ladder filters shown in FIG. 9A and FIG. 9B.

FIG. 9C illustrates the simulated insertion loss spectrum of an example BP ladder filter 900 (curve 920) and simulated insertion loss for the corresponding ladder filter 910 (curve 922) that includes an enhanced unit cell. As shown in Table 1 below, the resonant frequencies of the shunt and series of AW resonators of the unit cell 903e are similar to those of the unit cell 901. To achieve the insertion loss spectrums shown in FIG. 9C, the AW resonators of the BP ladder filter 910 and the BP ladder filter 900 should have parameter values shown in Table 1 below, include a shunt ground inductor at the input port 602 having an inductance of 14.8 nH, and include a shunt ground inductor at the output port 612 having and inductance of 7.5 nH. Further, the values of the inductors used in the enhanced unit cell 901 are $L_1$=1.6 nH, $L_2$=2.3 nH and $L_3$=7.8 nH where the coupling factor between the pair or mutually coupled inductors 818 and 816 is 0.9.

TABLE 1

| Unit cell | Series AW Res. | | Shunt AW Res. | |
|---|---|---|---|---|
| | Area ($\mu m^2$) | Freq. (MHz) | Area ($\mu m^2$) | Freq. (MHz) |
| 903a | 20000 | 1769 | 11688 | 1680 |
| 903b | 16472 | 1759 | 13032 | 1690 |
| 903c | 19726 | 1753 | 14274 | 1690 |
| 903d | 10188 | 1753 | 24240 | 1690 |
| 901 | 15822 | 1759 | 24888 | 1680 |

As shown in FIG. 9C the insertion loss spectrum of the ladder filter 910 (curve 922) has a passband 931 and a bandwidth 933 identical to or substantially similar to or the same as that of the ladder filter 900 (curve 920). However, the OOB rejection of the ladder filter 910 is larger than that of the ladder filter 900. Including the enhanced unit cell in the chain of unit cells of ladder filter 910 has introduced two additional broadband notches, a low frequency notch 938 located below the passband 931, and a high frequency notch 940 above the passband 931. As a result, the OOB rejection or the absolute value of the insertion loss for OOB frequencies is increased. For example, due to presence of additional low-frequency notch 938, the magnitude of the insertion loss 934b of a low frequency portion of the OOB frequencies for the ladder filter 910 is more than 10 dB larger than the magnitude of the insertion loss 934a for the same portion of the OOB frequencies for the ladder filter 900. Similarly, due to presence of high-frequency additional notch 940, the magnitude of the insertion loss 936b in a high frequency portion of the OOB frequencies for the ladder filter 910 is more than 10 dB larger than the magnitude of the insertion loss 936a for the same portion of the OOB frequencies for the ladder filter 900. Additionally, inclusion of the enhanced unit cell 901 in the ladder filter 910, has introduced new notches near the low-frequency notch 942 and high-frequency notch 944 at the edges of the passband 931. In some cases, the additional notches introduced by a replacing a unit cell (e.g., the last unit cell) of the ladder filter 900 may increase the magnitude of the insertion loss within different frequency intervals above and/or below the passband, by 5 dB, 10 dB, 15 dB, 20 dB, or larger values.

In various embodiments, a unit cell (e.g., unit cell 803) of a ladder filter may be changed to an enhanced unit cell by adding a rejection enhancing network to improve the OOB rejection of the ladder filter without affecting the impedance at the input or output ports and therefore without changing the design of the devices that are connected to the ladder filter. For example, the unit cells or the ladder filter 900 may be of the same type as the unit cell 803 and each may be enhanced simply by adding any of the rejection enhancing networks used in the enhanced unit cell 801 or the enhanced unit cell 805, further indicating that adding rejection enhancing networks to existing filter cells can be thought of as an agnostic solution.

The bandwidth (or passband bandwidth), roll-off slopes, OOB rejection, shape factor and other RF characteristics of a BP ladder filter that includes the unit cell 801 or 805 may be tailored by judicious selection of values of the mutual inductance M (or the corresponding coupling factor, k), and/or the inductance of the inductors 814, 816, 818, 820, 822, and/or 824, during a design process. In some embodiments, after fabricating the filter, one or more of these values are fine tuned to achieve a frequency response with a desired bandwidth, roll-off slope, OOB rejection, and/or shape factor. For example, one or more of these values may be adjusted while measuring the spectrum of the scattering parameters of the BP filter (e.g., using an RF network analyzer) in real time. The adjustment process can be resumed when the measured scattering parameters indicate that the characteristics of the frequency response are matched with a set of desired characteristics. In some examples, the value an inductance or a mutual inductance may be tuned by laser-trimming of printed coils, hand-tweaking of air-core wire-wound inductors, placement of a high-permeability material to increase mutual coupling, or the placement or removal of additional SMD inductors in parallel with the existing ones to effectively change their values.

In some embodiments, the inductance of one or more inductors and/or the mutual coupling between two inductors in a rejection enhancing network may be tuned to dynamically control the frequency response of the enhanced unit cell 801 or 805, or a BP ladder filter that includes the enhanced unit cell 801 or 805. In some cases, the mutual inductance M or the corresponding coupling factor, k), and/or the inductances of the inductor 814, 816, 818, 820, 822, and 824 the enhanced unit cell 801 (or 805) of the PB ladder filter may be dynamically controlled by a control system of a mobile device (e.g., mobile device 1000) or radio frequency front end. For example, the control system may adjust the bandwidth (or passband bandwidth), roll-off slopes, OOB rejection, shape factor and/or other RF characteristics of the ladder filter (e.g., a ladder filter in a multiplexer or demultiplexer), by dynamically tuning the inductances of the inductors or the mutual inductance of the unit cell 801. In some examples, an inductor or a pair of mutually coupled inductors of the enhanced unit cell 801 or 805 can be electromechanically tunable. In some such examples, a control signal generated by the control system may adjust the inductance or the mutual inductance of the corresponding inductor or the pair of mutually coupled inductors.

In some embodiments, the coupling factor (k) between the first inductor 818, having an inductance $L_1$, and the second inductor 816, having an inductance $L_2$, of the enhanced unit cell 801, can be tunable or used as a design parameter. A desired bandwidth (or passband bandwidth), roll-off slope, OOB rejection, shape factor and/or other RF characteristics of a ladder filter that includes the enhanced unit cell 801 may be achieved by tuning or selecting k.

Figure 10A:
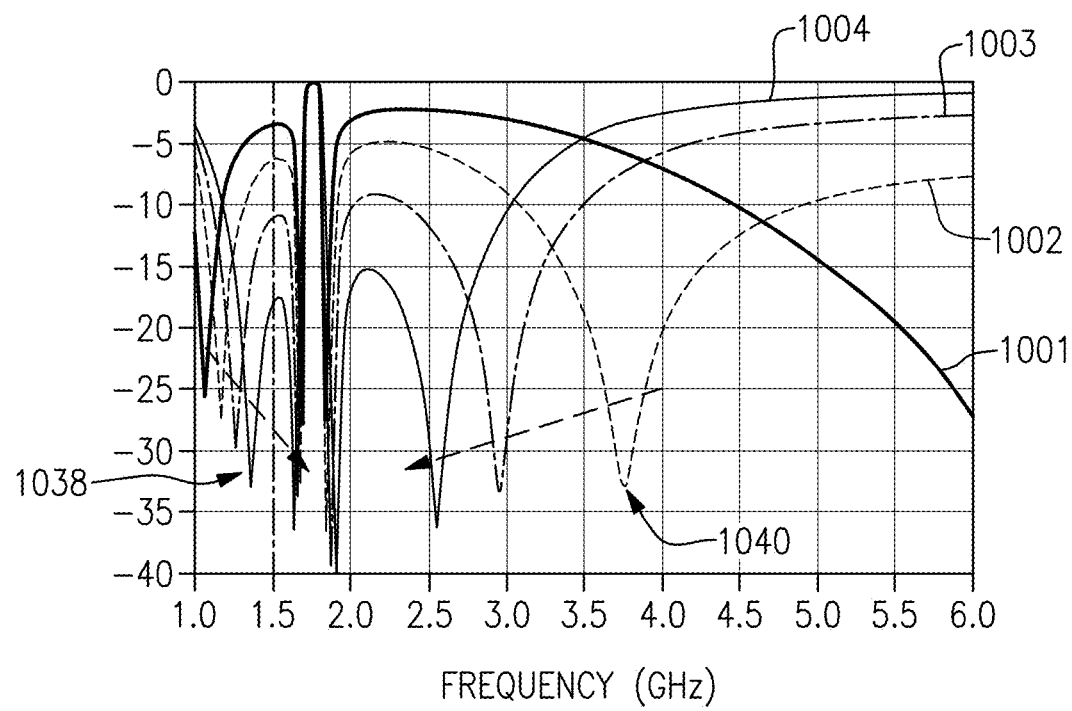
FIGS. 10A-10D illustrate the simulated insertion loss spectra of the ladder filter shown in FIG. 9B within four different frequency ranges and for four different values of the mutual coupling factor.
Figure 10B:
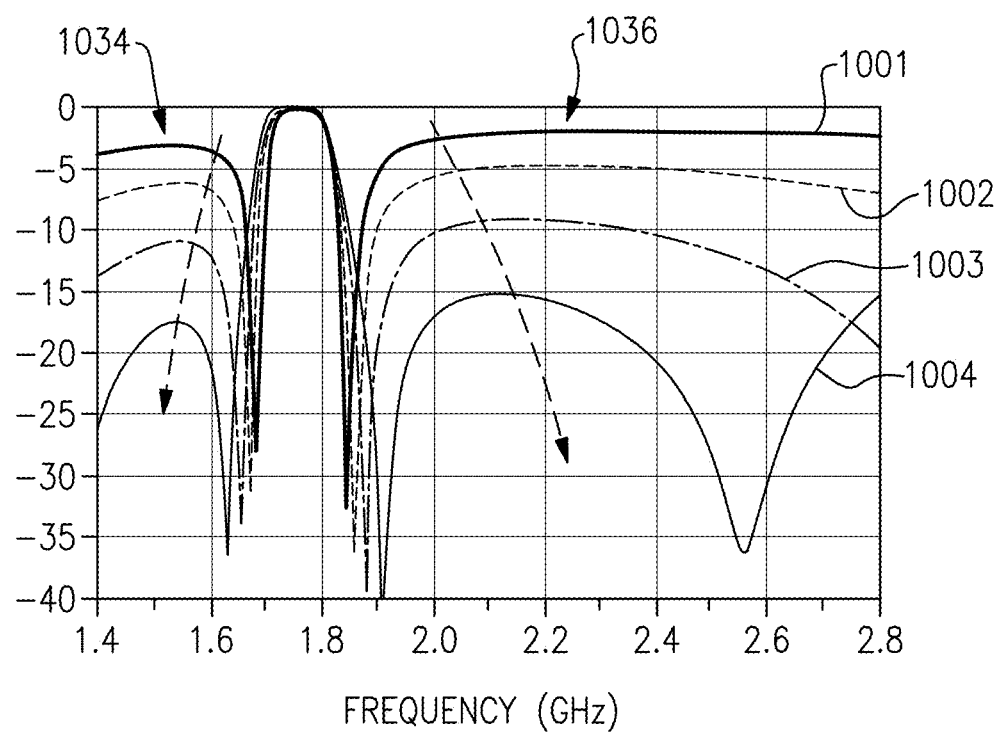
Figure 10C:
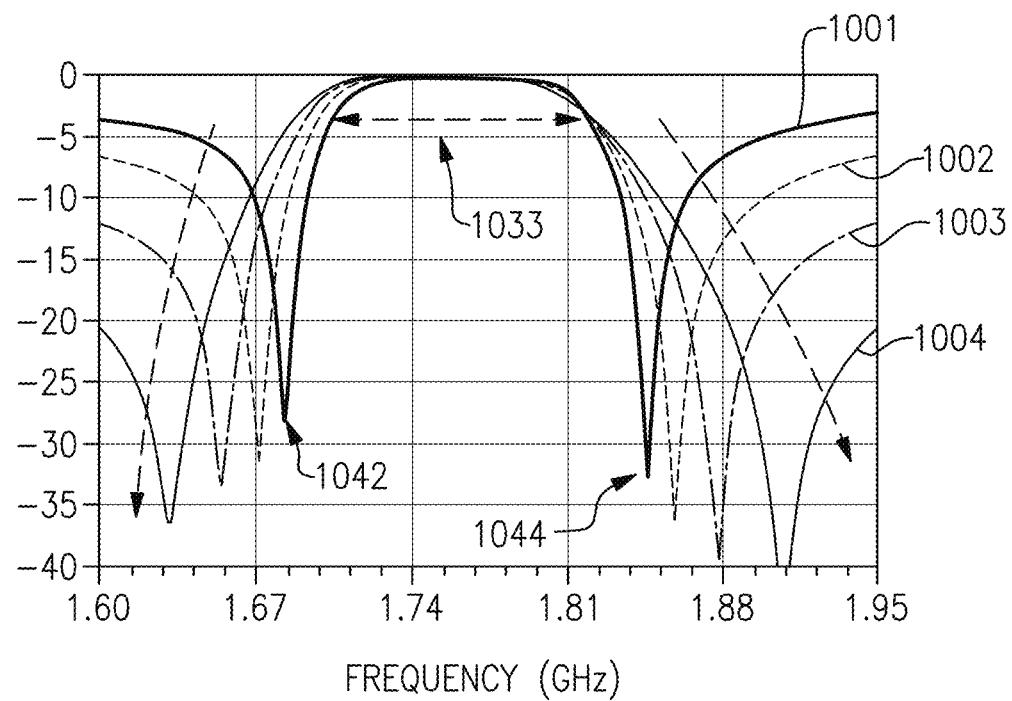
Figure 10D:
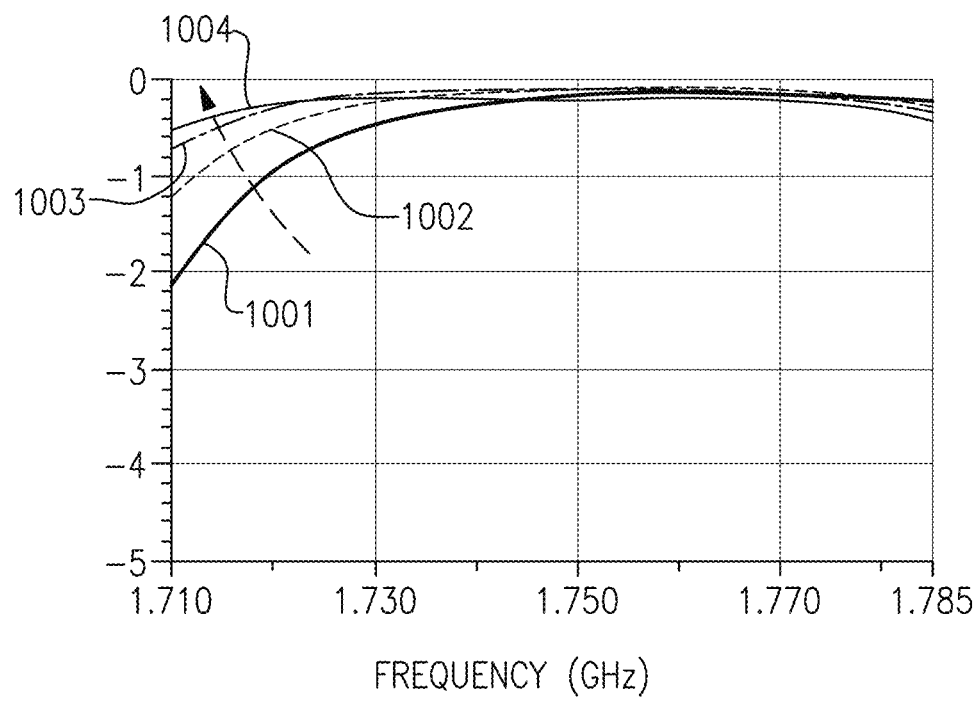

FIGS. 10A-10D illustrate the simulated insertion loss spectra of the ladder filter 910 for $L_1$=1.6 nH, $L_2$=2.3 nH, $L_3$=7.8 nH, and four different values of the coupling factor, k=0 (curve 1001), k=0.4 (curve 1002), k=0.7 (curve 1003) and k=0.9 (curve 1004) plotted within different frequency intervals. The resonant frequencies of the AW resonators in each cell of the ladder filter 901 are the values shown in Table 1. FIGS. 10A, 10B, 10C and 10D show the insertion loss spectrum from port-1 602 to port-2 612 of the BP filter 910 plotted from 1 GHz to 6 GHz, from 1.4 GHz to 2.8 GHz, from 0.6 GHz to 1.95 GHz, from 1.710 GHz to 1.785 GHz, respectively. The one-sided dashed arrows in FIGS. 10A-10D indicate the change direction of the insertion loss when k is increased. FIG. 10A shows that increasing k (from 0 to 0.9), monotonically reduces the frequency of the high-frequency additional notch 1040 and increased the frequency of the low-frequency additional notch 1038. FIG. 10B shows that increasing k increases the absolute value of OOB insertion loss 1036 at frequencies both above the passband, as well as the absolute value of OOB insertion loss 1034 at frequencies below the passband, without significantly affecting the in-band insertion loss. For example, increasing k from 0 to 0.9 increases the insertion loss at 2.2 GHz from about −2.5 dB to about −15 dB, and at 5 GHz from −4 dB to about −17.5 dB. FIG. 10C shows that increasing k increases the frequency of the high-frequency PB-notch 1044 and reduces the frequency of the low-frequency PB-notch 1042. As such increasing k effectively increases the bandwidth 1033 of the ladder filter 910. FIG. 10D shows that increasing k decreases the roll-off slope at low-frequency edge of the passband of the ladder filter 910.

In some embodiments, the inductance $L_1$ of the first inductor 818 of the enhanced unit cell 801, can be tunable. In some such embodiments, a desired bandwidth (or pass-band bandwidth), roll-off slope, OOB rejection, shape factor and/or other RF characteristics of a ladder filter that includes the enhanced unit cell 801 may be achieved by tuning or selecting $L_1$.

Figure 11A:
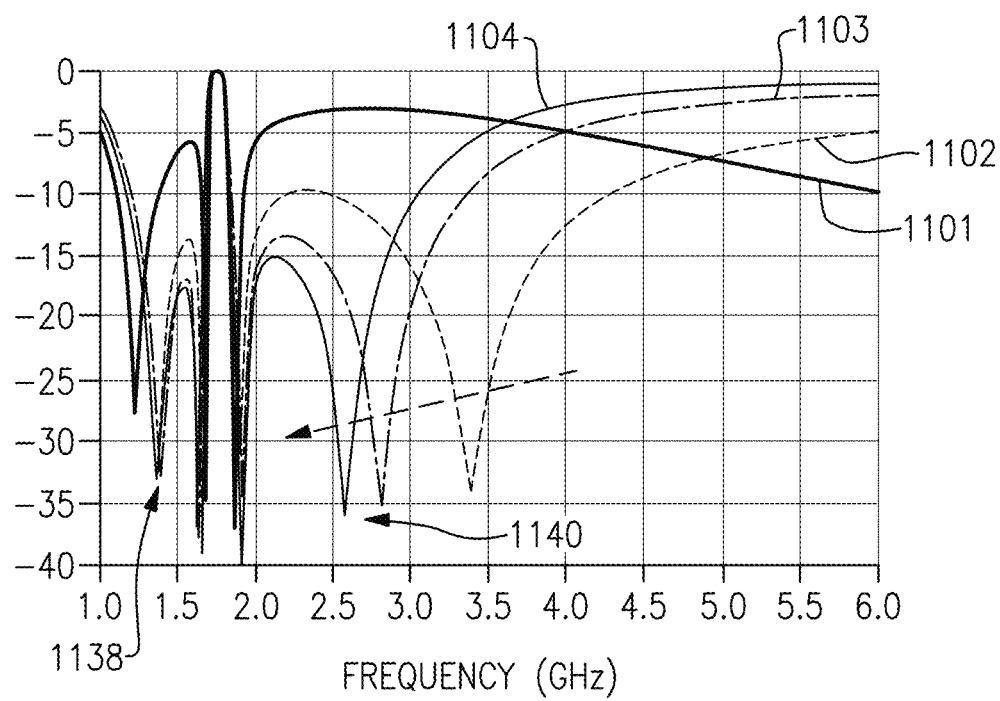
FIGS. 11A-11D illustrate the simulated insertion loss spectra of the ladder filter shown in FIG. 9B within four different frequency ranges and for four different values of the inductance $L_1$.
Figure 11B:
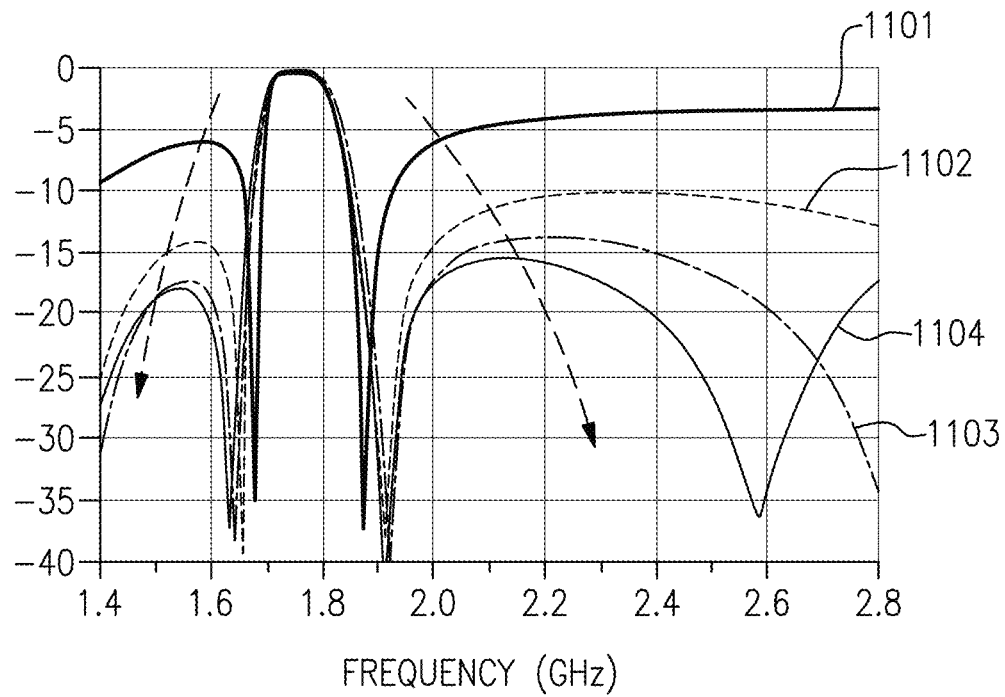
Figure 11C:
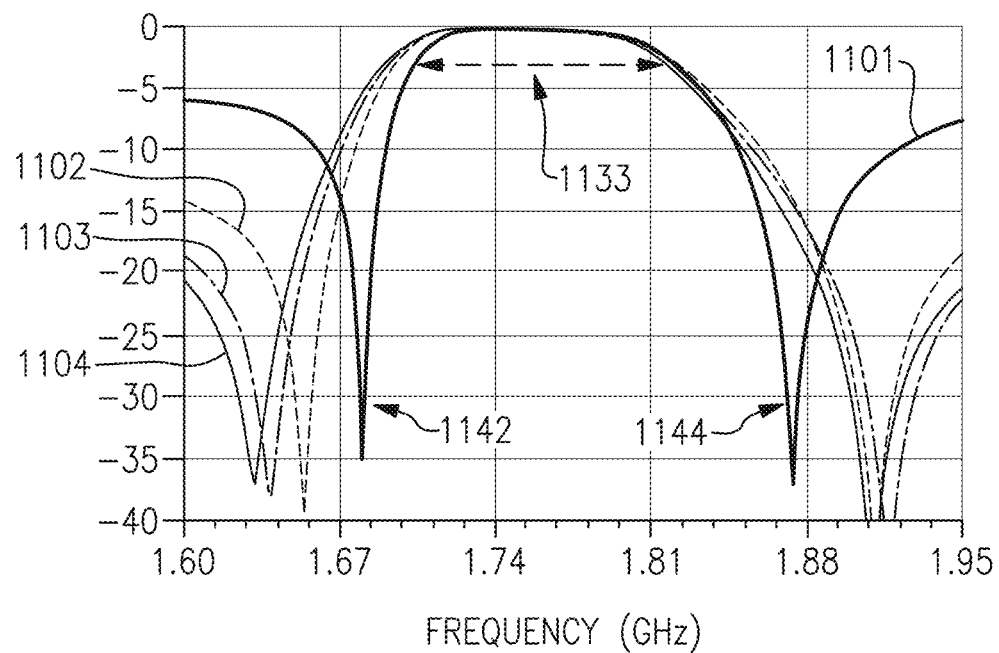
Figure 11D:
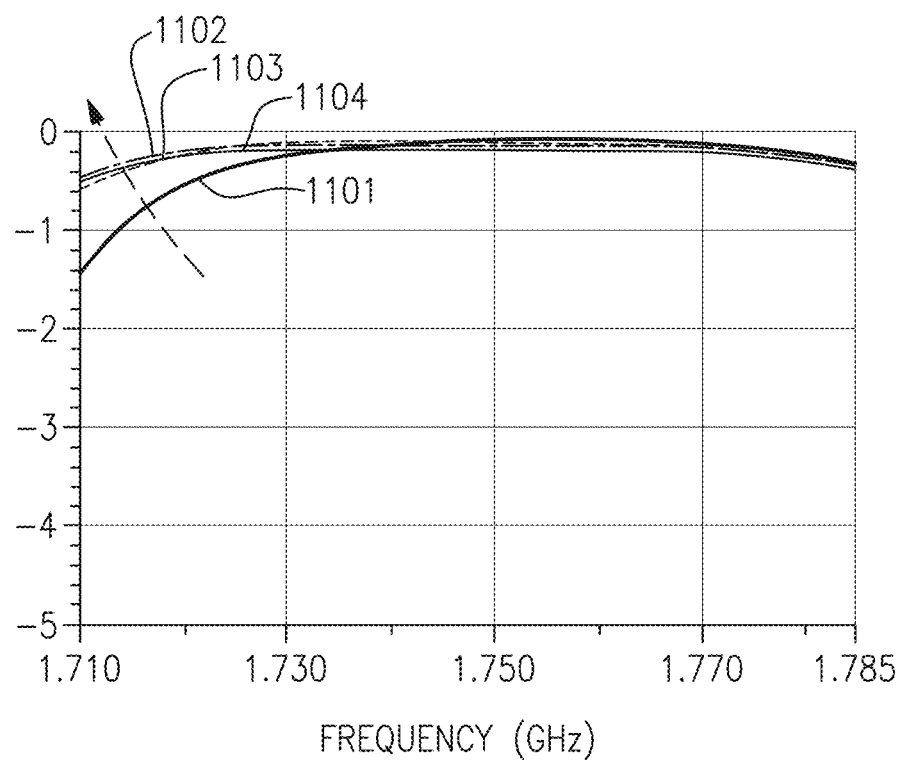

FIG. 11A-11D illustrate the calculated insertion loss spectra of the tunable filter 910 for $L_2$=2.3 nH, $L_3$=7.8 nH, k=0.9, and four different values of $L_1$, $L_1$=0 nH (curve 1101), $L_1$=0.5 nH (curve 1102), $L_1$=1.0 nH (curve 1103), and $L_1$=1.5 nH (curve 1104), plotted within different frequency intervals. The resonant frequencies of the AW resonators in each cell of the ladder filter 901 are the values shown in Table 1. FIGS. 11A, 11B, 11C and 11D show the insertion loss spectrum from port-1 602 to port-2 612 of the BP filter 910 plotted from 1 GHz to 6 GHz, from 1.4 GHz to 2.8 GHz, from 1.6 GHz to 1.95 GHz, from 1.710 GHz to 1.785 GHz, respectively. The dashed arrows in FIGS. 11A-11D indicate the change direction of the insertion loss when $L_1$ is increased. FIG. 11A shows that increasing $L_1$ (from 0 nH to 1.5 nH), monotonically reduces the frequency of the high-frequency additional notch 1140 and increases the frequency of the low-frequency additional notch 1138. FIG. 11B shows that that increasing $L_1$ increases the absolute value of OOB insertion loss at frequencies both above the passband, as well as the absolute value of OOB insertion loss at frequencies below the passband, without affecting the in-band insertion loss. For example, increasing $L_1$ from 0 to 0.9 increases the insertion loss at 2.2 GHz from about −3.5 dB to about −15 dB, and at 1.5 GHz from −4 dB to about −17.5 dB. FIG. 11C shows that increasing $L_1$ increases the frequency of high-frequency additional notch 1044 and reduces the frequency of the low-frequency notch 1142. As such increasing $L_1$ effectively increases the bandwidth 1133 of the ladder filter 910. FIG. 11D shows that that increasing $L_1$ decreases the roll-off slope at low-frequency edge of the passband of the filter 910.

In some embodiments, the inductance $L_2$ of the second inductor 816 of the enhanced unit cell 801, can be tunable. In some such embodiments, a desired bandwidth (or pass-band bandwidth), roll-off slope, OOB rejection, shape factor and/or other RF characteristics of a ladder filter that includes the enhanced unit cell 801 may be achieved by tuning or selecting $L_2$.

Figure 12A:
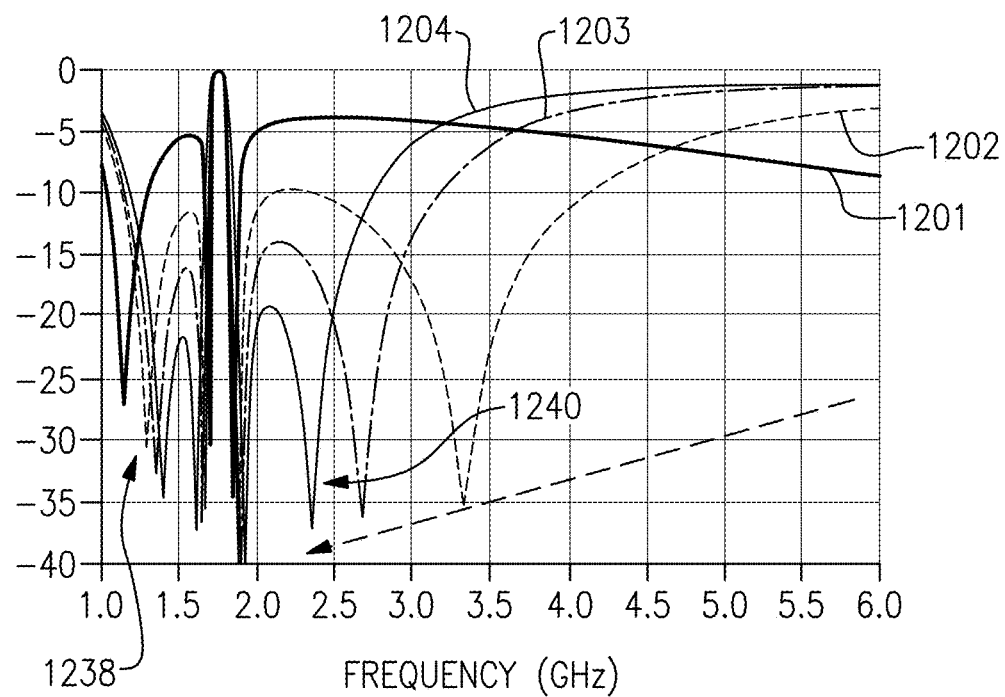
FIGS. 12A-12D illustrate the simulated insertion loss spectra of the ladder filter shown in FIG. 9B within four different frequency ranges and for four different values of the inductance $L_2$.
Figure 12B:
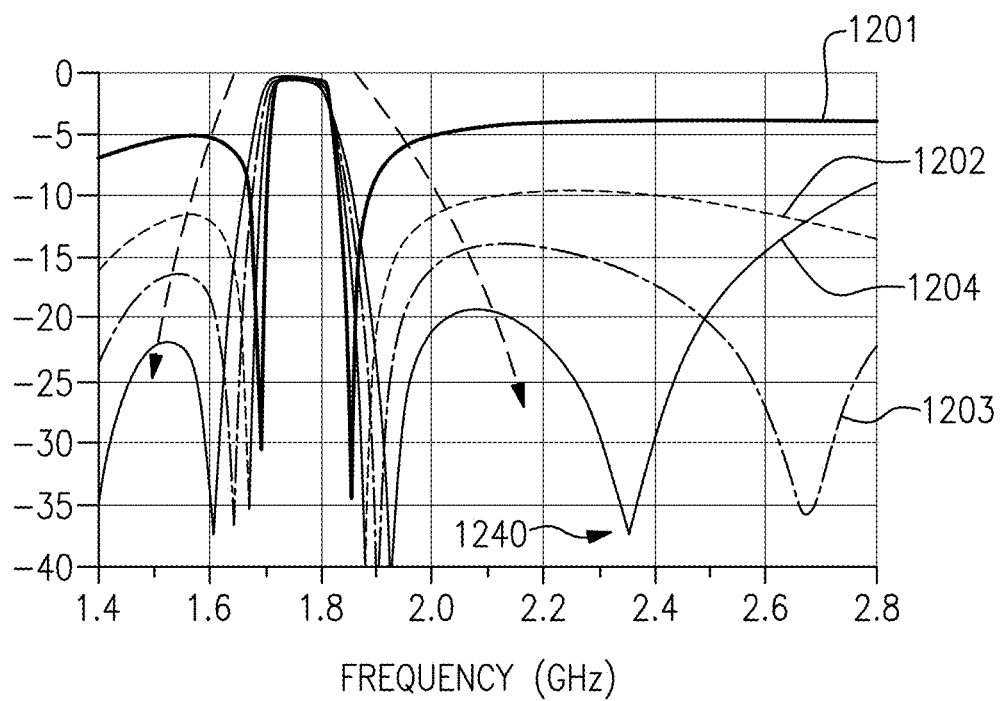
Figure 12C:
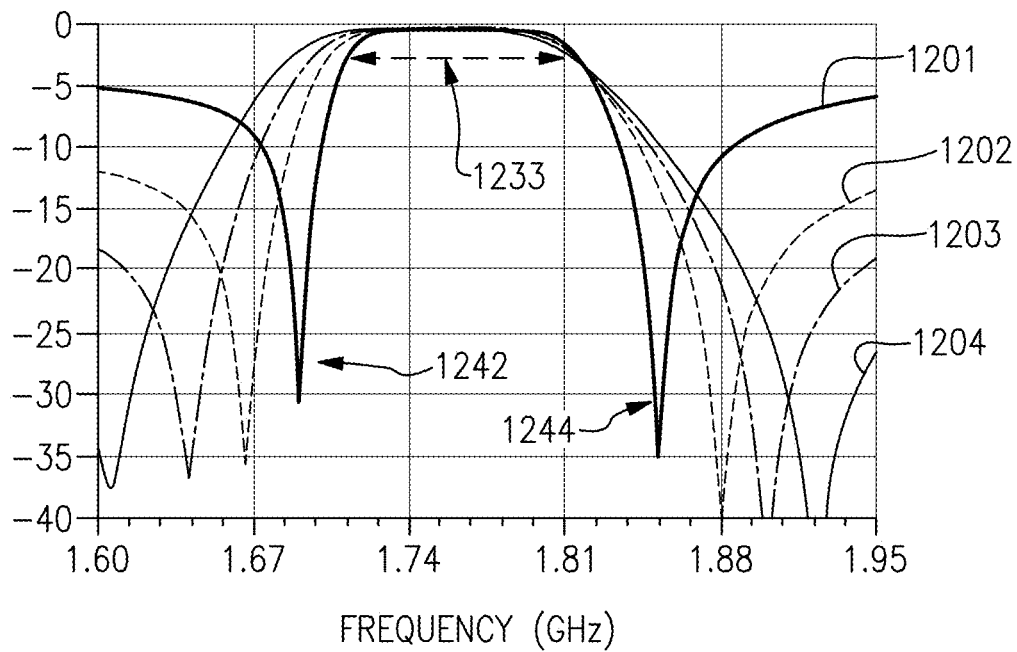
Figure 12D:
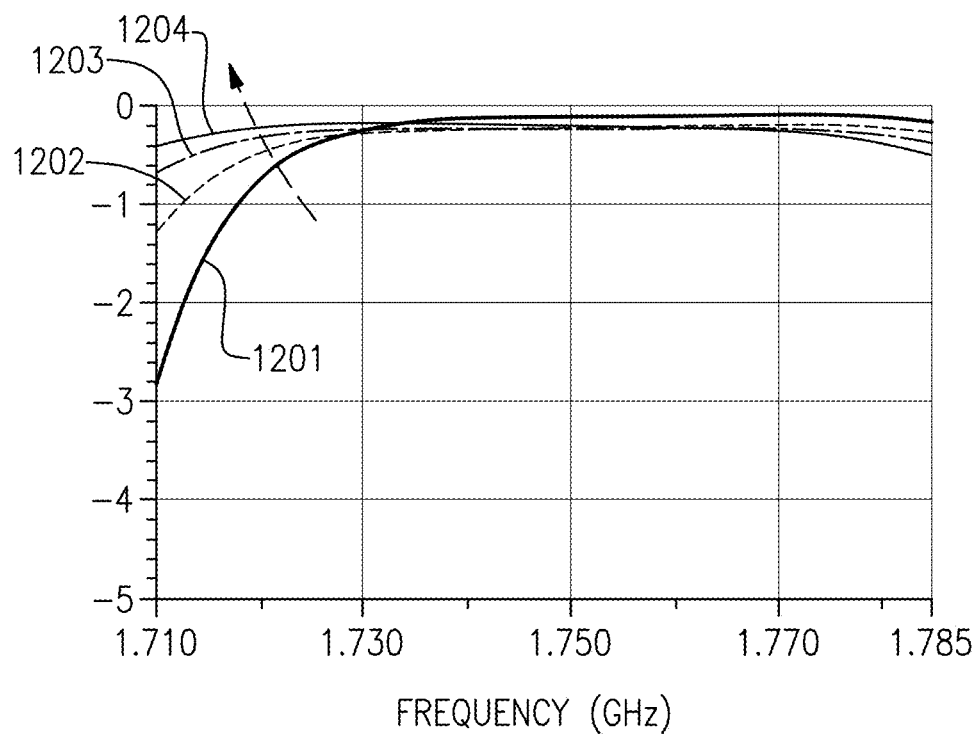

For example, the inductance of the second ($L_2$) inductor 818 of the enhanced unit cell 901 of the ladder filter 910 may be tunable. FIG. 12A-12D illustrate the calculated insertion loss spectra of the tunable filter 910 for $L_1$=1.6 nH, $L_3$=7.8 nH, k=0.9, and four different values of $L_2$, $L_2$=0 nH (curve 1201), $L_2$=1.0 nH (curve 1202), $L_2$=2.0 nH (curve 1203), and $L_2$=3.0 nH (curve 1204), plotted within different frequency intervals. The resonant frequencies of the AW resonators in each cell of the ladder filter 901 are the values shown in Table 1. FIGS. 12A, 12B, 12C and 12D show the insertion loss spectrum from port-1 602 to port-2 612 of the tunable filter 910 plotted from 1 GHz to 6 GHz, from 1.4 GHz to 2.8 GHz, from 1.6 GHz to 1.95 GHz, from 1.710 GHz to 1.785 GHz, respectively. The dashed arrows in the graphs indicate the change direction of the insertion loss when $L_2$ is increased. FIG. 12A shows that increasing $L_2$ (from 0 nH to 3 nH), monotonically reduces the frequency of the high-frequency additional notch 1240 and increases the frequency of the low-frequency additional notch 1238. FIG. 12B shows that that increasing $L_2$ increases the absolute value of OOB insertion loss at frequencies both above the passband, as well as the absolute value of OOB insertion loss at frequencies below the passband, without affecting the in-band insertion loss. For example, increasing $L_2$ from 0 nH to 3.0 nH increases the insertion loss at 2.2 GHz from about −4.5 dB to about −22 dB, and at 1.5 GHz from −5 dB to about −22 dB. FIG. 12C shows that increasing $L_2$ increases the frequency of high-frequency notch 1244 and reduces the frequency of the low-frequency notch 1242. As such increasing $L_2$ effectively increases the bandwidth 1233 of the ladder filter 910. FIG. 12D shows that that increasing $L_2$ decreases the roll-off slope at low-frequency edge of the passband of the filter 910.

In some embodiments, the inductance $L_3$ of the third inductor 814 of the enhanced unit cell 801, can be tunable. In some such embodiments, a desired bandwidth (or pass-band bandwidth), roll-off slope, OOB rejection, shape factor and/or other RF characteristics of a ladder filter that includes the enhanced unit cell 801 may be achieved by tuning or selecting $L_3$.

Figure 13A:
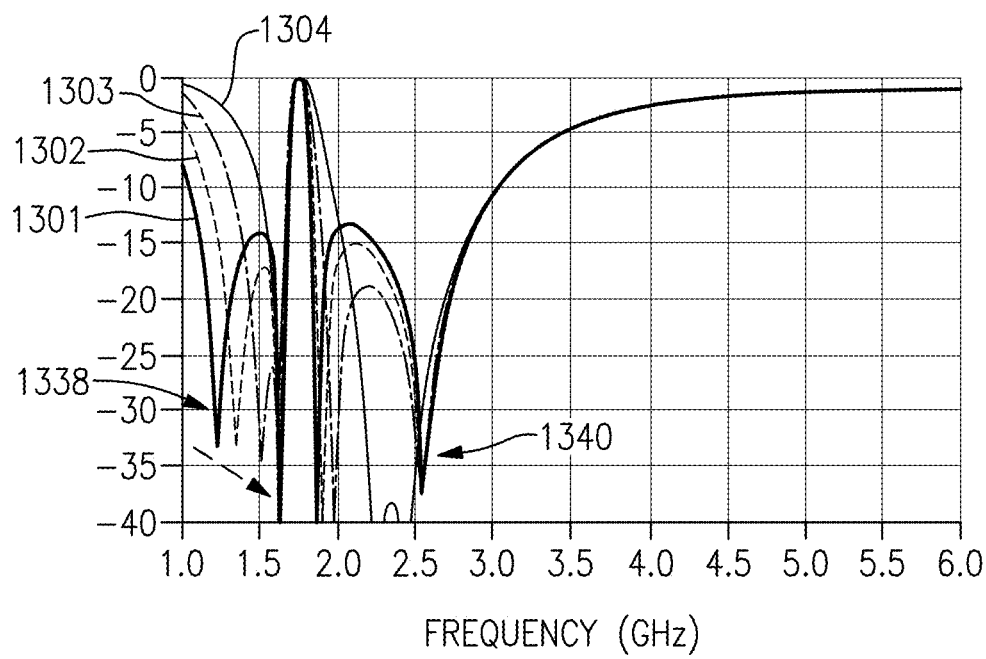
FIGS. 13A-13D illustrate the simulated insertion loss spectra of the ladder filter shown in FIG. 9B within four different frequency ranges and for four different values of the inductance $L_3$.
Figure 13B:
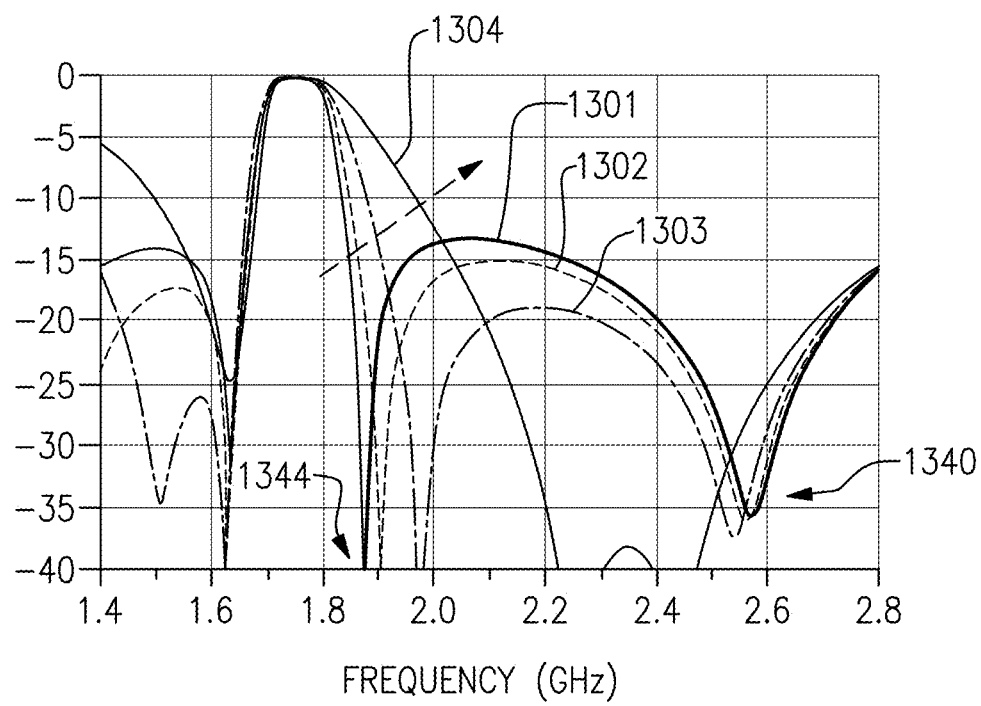
Figure 13C:
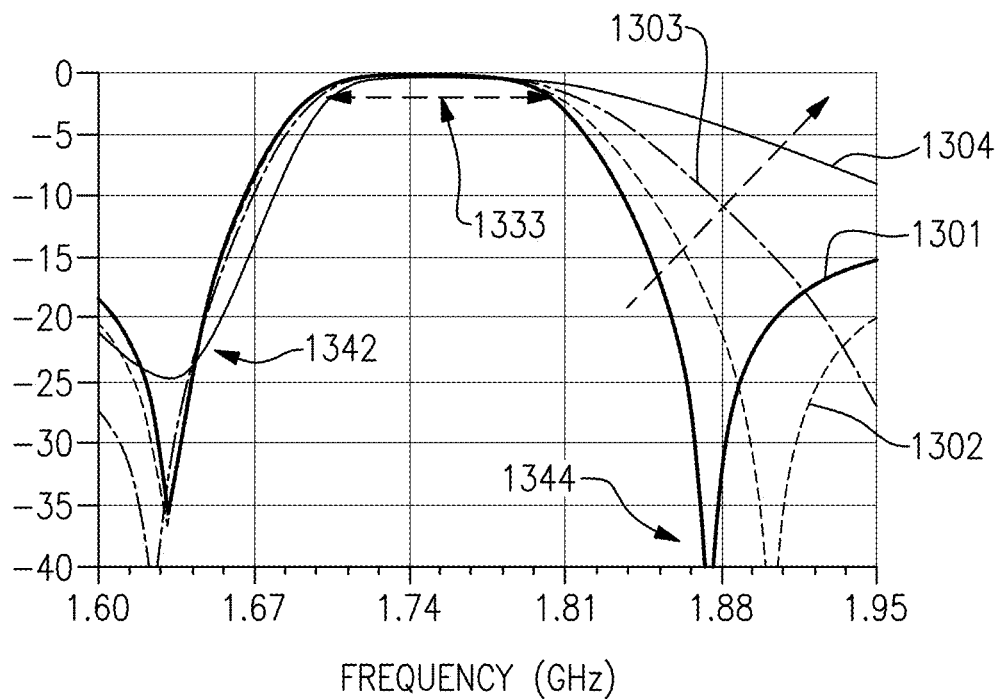
Figure 13D:
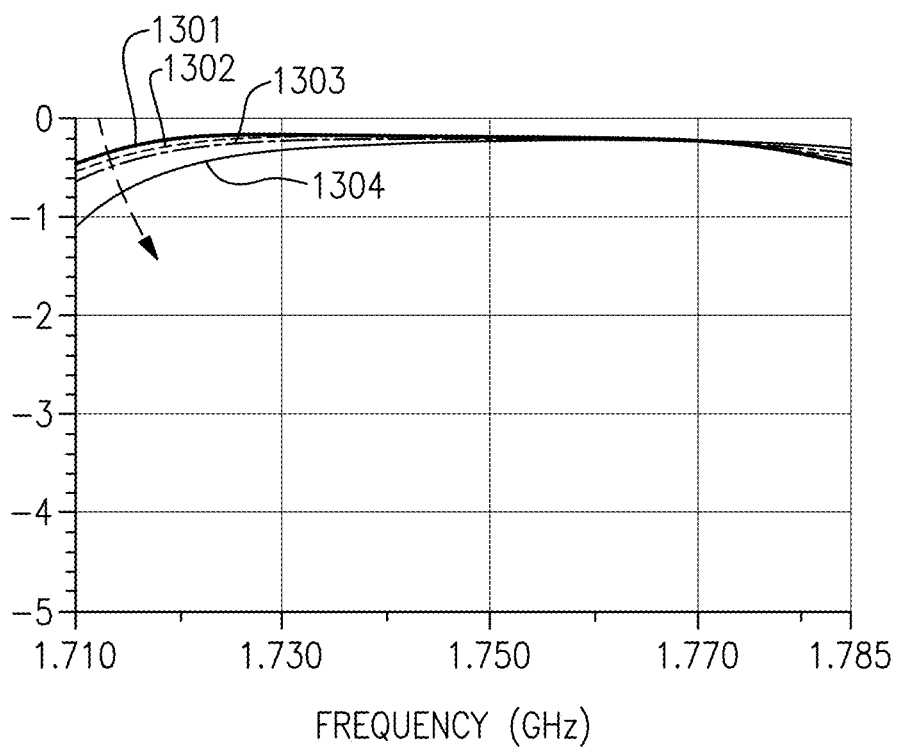

FIG. 13A-13D illustrate the calculated insertion loss spectra of the tunable filter 910 for $L_1$=1.6 nH, $L_2$=2.3 nH, k=0.9, and four different values of $L_3$, $L_3$=10 nH (curve 1301), $L_3$=8.0 nH (curve 1302), $L_3$=6.0 nH (curve 1303), and $L_4$=4.0 nH (curve 1304), plotted within different frequency intervals. The resonant frequencies of the AW resonators in each cell of the ladder filter 901 are the values shown in Table 1. FIGS. 13A, 13B, 13C and 13D show the insertion loss spectrum from port-1 602 to port-2 612 of the tunable filter 910 plotted from 1 GHz to 6 GHz, from 1.4 GHz to 2.8 GHz, from 1.6 GHz to 1.95 GHz, from 1.710 GHz to 1.785 GHz, respectively. The dashed arrows in the graphs indicate the change direction of the insertion loss when $L_3$ is reduced. FIGS. 13A and 13B show that decreasing $L_3$ from 10.0 nH to 6.0 nH does not significantly change the position and the depth of the high-frequency additional notch 1340 but it increases the attenuation (absolute value of insertion loss) between the high-frequency notch and the additional high-frequency notch 1040. FIGS. 13A and 13B show that further reducing $L_3$ from 6.0 nH to 4.0 nH reduces the frequency of high-frequency additional notch 1340 and splits it into two closely spaced notches resulting in a larger bandwidth and significantly larger (>15 dB) increase in OOB rejection above the high-frequency notch and the high-frequency additional notch 1340. FIG. 13C shows that decreasing $L_3$ from 10.0 nH to 4.0 nH increases the bandwidth 1333 by increasing the frequency of the high-frequency notch 1344 without affect in the in-band insertion loss. Further, decreasing $L_3$, reduces the roll-off slope of the high-frequency edge of the passband. FIG. 13D shows that decreasing $L_3$ from 10.0 nH to 6.0 nH, does not significantly affect the low-frequency edge of the passband, while further decreasing $L_3$ from 6.0 nH to 4.0 nH increases the roll-off slope of the low-frequency edge of the passband.

FIGS. 14A-14D represent the simulated voltage reflection coefficients (scattering parameters) at the input port 602 ($S_{11}$ parameter) and the output port 612 ($S_{11}$ parameter) of the ladder filter 910 (with an enhanced unit cell) and the ladder filter 900 (without any enhanced unit cell) between 1.710

GHz and 1.785 GHz, when an input ground inductor is connected to the input port 602 and an output ground inductor is connected to the output port 612. To achieve the results shown in FIGS. 14A-14D, the AW resonators included in the ladder filter 910 and ladder filter 900 should have parameter values shown in Table 1 above, the ground inductor at the input port 602 should have an inductance of 14.8 nH and the ground inductor at the output port 612 should have an inductance of 7.5 nH. The AW resonators used in unit cell 903*a* are identical to those used in the enhanced unit cell 901. Further, the values of the inductors used in the enhanced unit cell 901 are $L_1$=1.6 nH, $L_2$=2.3 nH and $L_3$=7.8 nH, and the coupling factor between the pair or mutually coupled inductors 818 and 816 is 0.9.

Figure 14A:
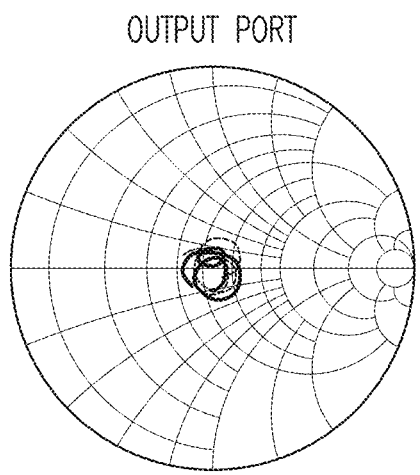
FIGS. 14A-14D represent the simulated voltage reflection coefficients (scattering parameters) at the input port and the output port of the ladder filter shown in FIG. 9B.
Figure 14B:
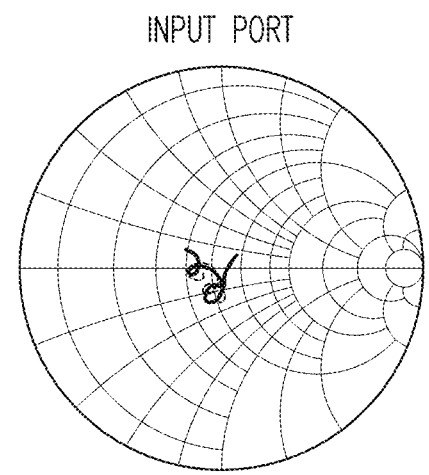

FIG. 14A shows a polar plot of the simulated voltage reflection coefficient ($S_{22}$) at the output port 612 of the ladder filter 900 (solid curve) and ladder filter 910 (dashed curve), on a Smith chart. FIG. 14B shows a polar plot of the simulated voltage reflection coefficient ($S_{11}$) at the input port 602 of the ladder filter 900 (solid curve) and ladder filter 910 (dashed curve), on a Smith chart. The concentration of the voltage reflection coefficients near the center of the Smith chart in FIGS. 14A-14B, indicates that the impedance of the input port 602 and output port 612 for RF signals having frequencies between 1.710 GHz and 1.785 GHz is close to the reference impedance (e.g., 50 ohm) used for this simulation. Advantageously, having an impedance close to the reference impedance may enable efficient signal transmission between the ladder filters 910 and 900 and devices or circuits that provide an input signal to these filters (e.g., an amplifier) or receive filtered signals from these filters (e.g., an antenna). Moreover, FIGS. 14A and 14B show that replacing the last unit cell 903*e* of the ladder filter 900 with the enhanced unit cell 901 does not affect the impedance of the input and the output ports. As such, a conventional unit cell (e.g., unit cell 803) of a ladder filter may be changed to an enhanced unit cell (e.g., by adding the network of three inductors shown in FIG. 8A) to improve the OOB rejection of the ladder filter without affecting the impedance at the input or output ports and therefore without changing the design of the devices that are connected to the ladder filter.

Figure 14C:
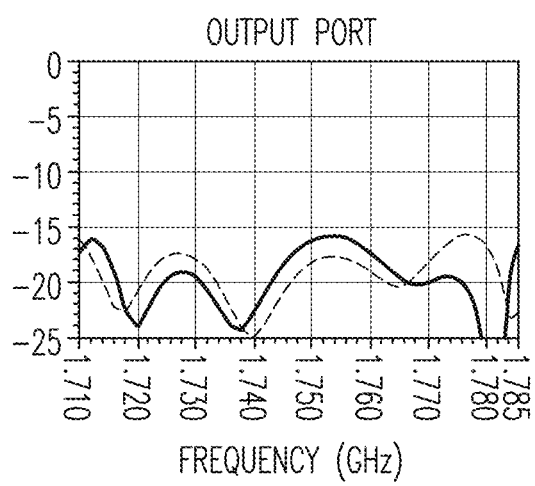
Figure 14D:
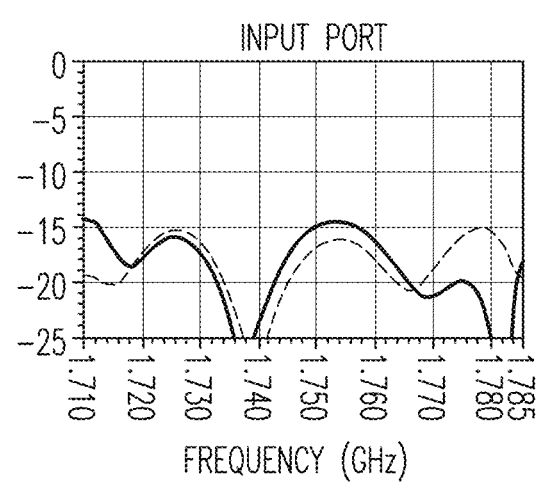

FIG. 14C shows the spectrum of the reflected electromagnetic power ratio (20×$\log_{10}$ ($S_{22}$), where $S_{22}$ is the voltage reflection coefficient) at the output port 612 of the ladder filter 900 (solid curve) and ladder filter 910 (dashed curve). FIG. 14D shows the spectrum of the reflected electromagnetic power voltage reflection coefficient (20×$\log_{10}$ ($S_{11}$), where $S_{11}$ is the voltage reflection coefficient) at the input port 602 of the ladder filter 900 (solid curve) and ladder filter 910 (dashed curve). For both input and output ports, the reflected electromagnetic power ratio stays below −15 dB between 1.710 GHz and 1.785 GHz, indicating that the impedances of these ports are close to the reference impedance (e.g., 50 ohm) used for the simulation. Moreover, FIGS. 14C and 14D show that replacing the last unit cell 903*e* of the ladder filter 900 with the enhanced unit cell 901 does not significantly affect the return loss of the filter's input and the output ports.

Figure 15A:
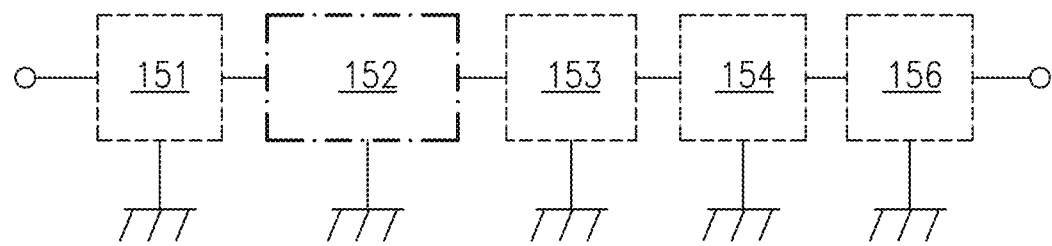
FIGS. 15A-15C illustrate examples of ladder filters that include one or more enhanced unit cells.
Figure 15B:
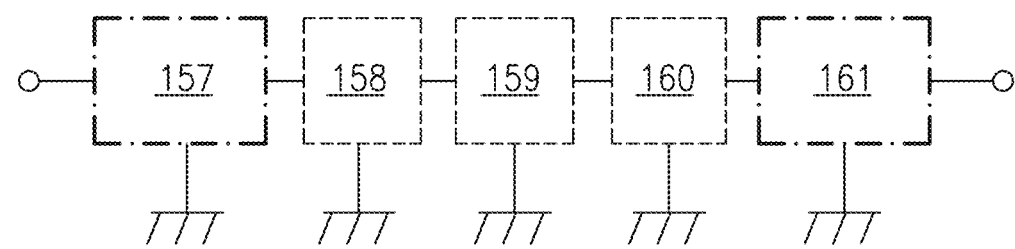
Figure 15C:
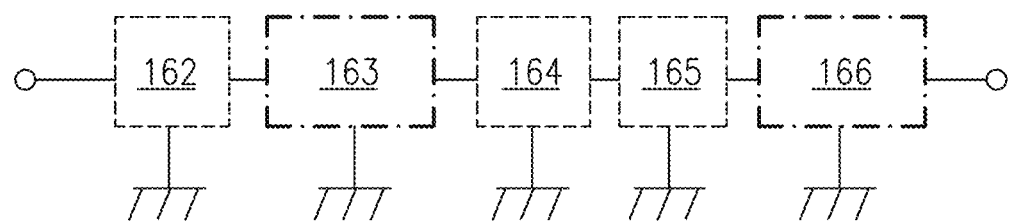

FIGS. 15A-15C illustrate alternative examples of ladder filters that include one or more enhanced unit cells. The filter shown in FIG. 15A comprises five unit cells 151-156 where the second unit cell 152 is an enhanced unit cell. Unit cells 151, and 153-156 can be similar to unit cell 803. The filter shown in FIG. 15B comprises five unit cells 157-161 where the first unit cell 152 and the last unit cell 161 are enhanced unit cells. Unit cells 158-160 can be similar to unit cell 803. The enhanced unit cell 157 and 161 may include similar or different rejection enhancing networks. The filter shown in FIG. 15C comprises five unit cells 162-166 where the second unit cell 163 and the last unit cell 166 are enhanced unit cells. Unit cells 163-165 can be similar to unit cell 803.

The principles and advantages disclosed herein can apply to BP ladder filters having larger number of unit cells, different types of unit cells. The principles and advantages disclosed herein are not limited to BP filters used in multiplexers and demultiplexers and can be applied to any other device, system or application that requires bandpass filtering and may benefit from improved OOB rejection.

Any suitable principles and advantages disclosed herein can be applied to filter topologies other than ladder topology.

Radio Frequency Systems and Devices with Bandpass Filters

The BP filters disclosed herein can be included in radio frequency systems, such as in a radio frequency front end. A BP filter in accordance with any suitable principles and advantages disclosed herein be implemented at any suitable location in a system that could benefit from improved OOB rejection provided by filters disclosed herein.

The BP filters disclosed herein can be included in wireless communication devices, such as mobile devices. One or more BP filters in accordance with any suitable principles and advantages disclosed herein can be implemented in any suitable wireless communication device. For example, the front end system 1023 can include multiplexers and demultiplexers that employ ladder filters having one or more enhanced unit cells.

Applications, Terminology, and Conclusion

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 450 MHz to 8.5 GHz. Tunable filters disclosed herein can filter RF signals at frequencies up to and including millimeter wave frequencies, for example, frequencies within FR2 of a 5G NR specification.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel filters, wireless communication devices, apparatus, methods, and systems described herein may be embodied in a variety of other forms. Furthermore, various omissions, substitutions and changes in the form of the filters, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A radio frequency filter configured to allow transmission within a passband, the filter comprising:
   a first filter cell including first and second ports and a series/shunt acoustic resonator pair connected between the first and second ports; and
   a second filter cell including a third port connected to the second port, a fourth port, first, second, third and fourth inductors, a second series acoustic resonator connected in series with the first inductor between the third port and a first node, the second inductor connected between the first node and the fourth port, a second shunt acoustic resonator and the third inductor connected in series between the first node and a ground potential, and the fourth inductor connected between the third port and the fourth port.

2. The radio frequency filter of claim 1 wherein the first filter cell does not include an inductor connected in series between an acoustic resonator and the ground potential.

3. The radio frequency filter of claim 2 wherein the first filter cell does not include an inductor coupled in series between the first and second ports.

4. The radio frequency filter of claim 1 wherein the radio frequency filter comprises a first filter port connected to the fourth port of the second filter cell, and a second filter port, the radio frequency filter configured to allow transmission within a passband between the first filter port and the second filter port.

5. The radio frequency filter of claim 4 wherein the radio frequency filter comprises one or more additional filter cells each including a series/shunt acoustic resonator pair, the one or more additional filter cells connected in series between the second filter port and the first port of the first filter cell.

6. The radio frequency filter of claim 5 wherein the first filter cell and the one or more additional filter cells do not include more than one inductor.

7. The radio frequency filter of claim 1 wherein the radio frequency filter comprises a first filter port and a second filter port, the radio frequency filter configured to allow transmission within a passband between the first filter port and the second filter port, and the radio frequency filter further comprising a third filter cell connected between the second filter port and the first port of the first filter cell, the third filter cell including fifth and sixth ports, fifth, sixth, seventh, and eighth inductors, a third series acoustic resonator connected in series with the fifth inductor between the fifth port and a second node, and a third shunt acoustic resonator and the sixth inductor connected in series between the second node and a ground potential, the seventh inductor connected between the second node and the sixth port, and the eighth inductor connected between the fifth port and the sixth port.

8. The radio frequency filter of claim 7 further comprising one or more additional filter cells each including a series/shunt acoustic resonator pair, the one or more additional filter cells connected between the second filter port and the fifth port of the third filter cell.

9. The radio frequency filter of claim 7 wherein the fifth port of the third filter cell is connected to the second filter port.

10. The radio frequency filter of claim 1 wherein one or more of the first, second, and third inductors are tunable.

11. A radio frequency front end comprising:
   a multiplexer including a plurality of first filters, a first port, and a plurality of second ports, each of the plurality of first filters connected between the first port and a respective one of the second ports, each of the plurality of first filters having at least one first filter cell including third and fourth ports, a series acoustic resonator and a first inductor connected in series between the third port and a node, a second inductor connected between the node and the fourth port, a third inductor and a shunt acoustic resonator connected in series between the node and a ground potential, and a fourth inductor connected between the third port and the fourth port; and
   one or more power amplifiers, the multiplexer configured to multiplex transmit signals generated by the one or more power amplifiers.

12. The radio frequency front end of claim 11 further comprising a demultiplexer including a plurality of second filters and a plurality of fifth ports, each of the plurality of second filters connected between the first port and a respective one of the fifth ports, each of the plurality of second filters having at least one filter cell including sixth and seventh ports, a second series acoustic resonator and a fifth inductor connected in series between the sixth port and a second node, a sixth inductor connected between the second node and the seventh port, a seventh inductor and a second shunt acoustic resonator connected in series between the second node and the ground potential, and an eighth inductor connected between the sixth port and the seventh port, the demultiplexer configured to demultiplex one or more receive signals.

13. The radio frequency front end of claim 11 wherein at least one of the plurality of first filters further includes a second filter cell including a series/shunt acoustic resonator pair.

14. The radio frequency front end of claim 13 wherein the second filter cell does not include an inductor connected in series between an acoustic resonator and the ground potential.

15. The radio frequency front end of claim 11 wherein the second filter cell does not include any inductor.

16. The radio frequency front end of claim 14 wherein the second filter cell includes a fifth port and a sixth port, and does not include an inductor connected in series between the fifth port and the sixth port.

17. A mobile device including the radio frequency front end of claim 11 and an antenna coupled to the radio frequency front end.

18. A radio frequency front end including:
a demultiplexer including a plurality of filters and a plurality of first ports, each of the plurality of filters connected between a second port and a respective one of the first ports, each of the plurality of filters having at least one filter cell including third and fourth ports, a series acoustic resonator and a first inductor connected in series between the third port and a node, a second inductor connected between the node and the fourth port, a third inductor and a shunt acoustic resonator connected in series between the node and a ground potential, and a fourth inductor connected between the third port and the fourth port, the demultiplexer configured to demultiplex a plurality of receive signals; and
a plurality of receive paths, each receive path coupled to a respective one of the plurality of receive signals.

19. The radio frequency front end of claim 18 wherein at least one of the plurality of filters further includes a second filter cell including a series/shunt acoustic resonator pair.

20. The radio frequency front end of claim 18 wherein the second filter cell does not include an inductor.

* * * * *